United States Patent
Nakae

[11] Patent Number: 5,989,756
[45] Date of Patent: Nov. 23, 1999

[54] PHOTO MASK AND METHOD FOR FABRICATING SEMICONDUCTOR DEVICES USING THE PHOTO MASK

[75] Inventor: Akihiro Nakae, Tokyo, Japan

[73] Assignee: Mitsubishi Denki Kabushiki Kaisha, Tokyo, Japan

[21] Appl. No.: 09/055,261

[22] Filed: Apr. 6, 1998

[30] Foreign Application Priority Data

Oct. 6, 1997 [JP] Japan .................................... 9-272961

[51] Int. Cl.⁶ ........................................................ G03F 9/00
[52] U.S. Cl. ............................................................... 430/5
[58] Field of Search ................................ 430/5, 322, 324

[56] References Cited

U.S. PATENT DOCUMENTS

| | | | |
|---|---|---|---|
| 5,424,154 | 6/1995 | Borodovsky | 430/5 |
| 5,429,897 | 7/1995 | Yoshioka et al. | 430/5 |
| 5,563,012 | 10/1996 | Neisser | 430/5 |
| 5,733,687 | 3/1998 | Tanaka et al. | 430/5 |

FOREIGN PATENT DOCUMENTS 7-36174  2/1995  Japan .

*Primary Examiner*—S. Rosasco
*Attorney, Agent, or Firm*—McDermott, Will & Emery

[57] ABSTRACT

A photoresist mask for use in a photolithographic process for fabricating semiconductor devices. The photo mask including a transparent substrate, and at least two light blocking regions. The at least two light blocking regions are separated by a first opening and arranged at a first pitch $P_1$ satisfying the following relationship on a main surface of the transparent substrate in a first direction:

$$P_1 > 2\lambda/NA\,(1+\sigma)$$

where $\lambda$ represents a wavelength of exposure light in an exposure system, NA represents a numerical aperture of the exposure system and C represents coherency of the exposure light. The at least two light blocking regions are formed with second openings at second pitches smaller than the first pitch in the first direction and the second openings have the exposure light transmitting therethrough, which has a weaker intensity than the exposure light transmitting through the first opening.

5 Claims, 23 Drawing Sheets

$P_{ave} = (2p_{x1} + p_{x2})/3$

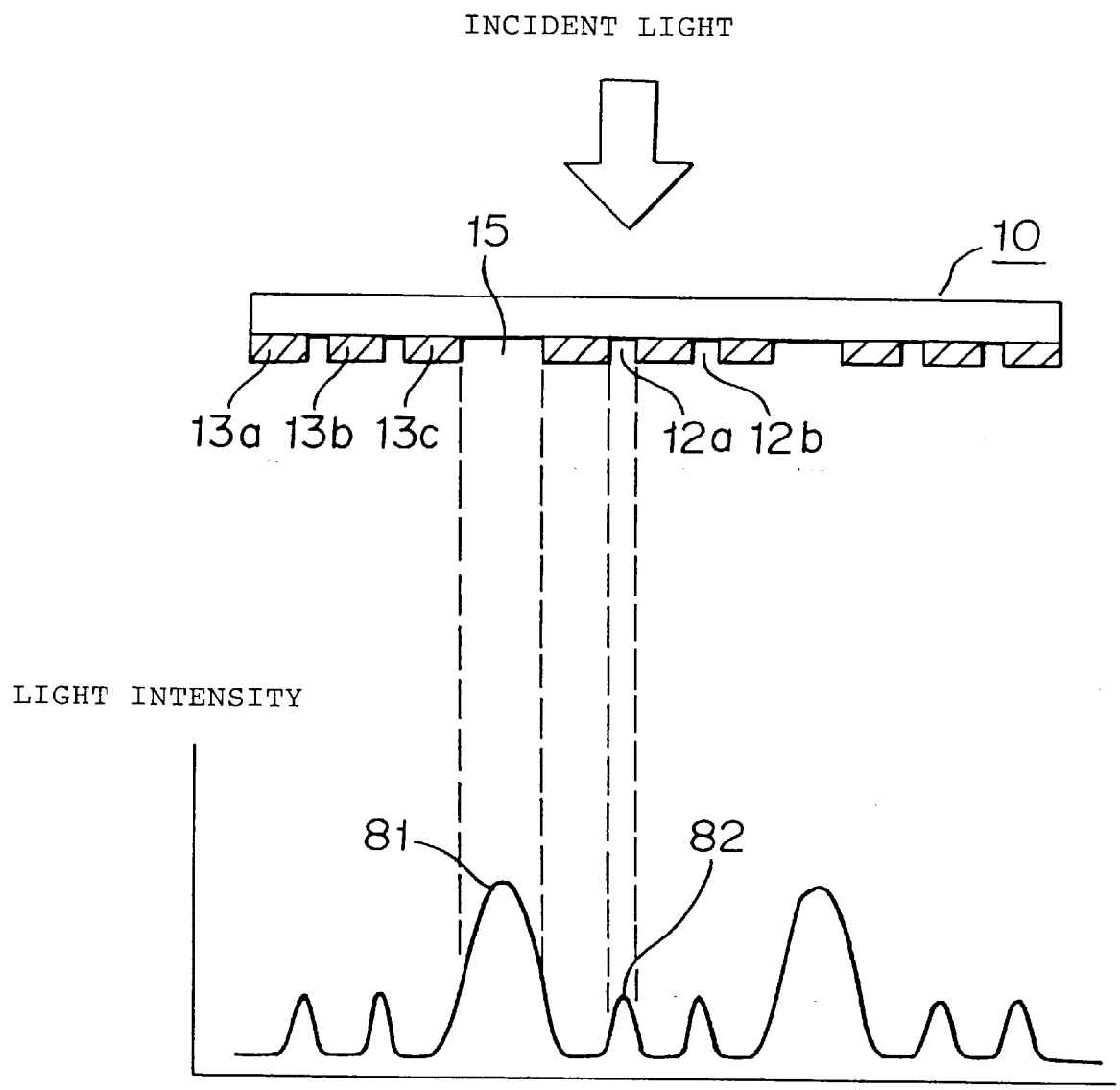

$P_{ave} = (2p_x3 + p_x4)/3$

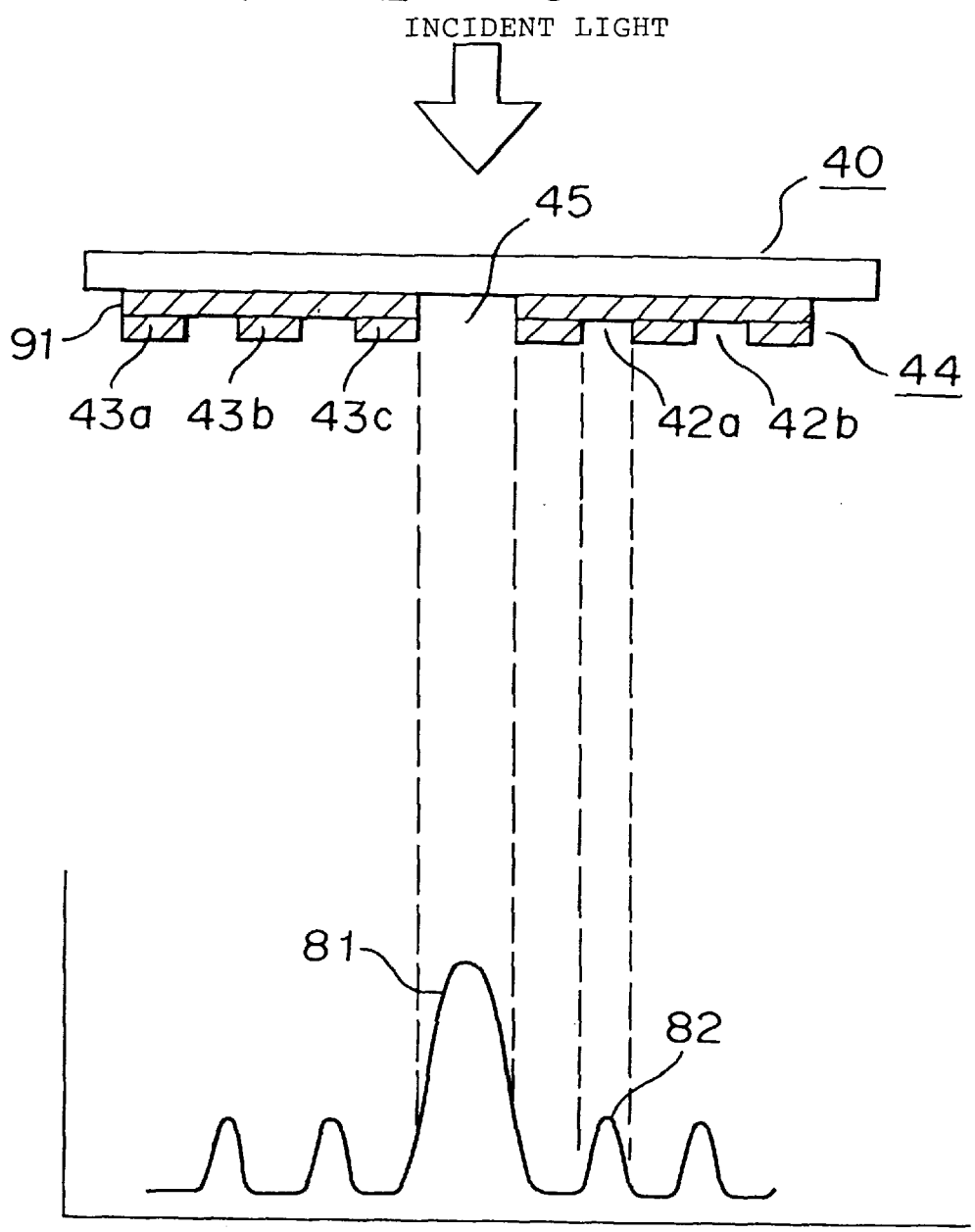

FIGURE 27
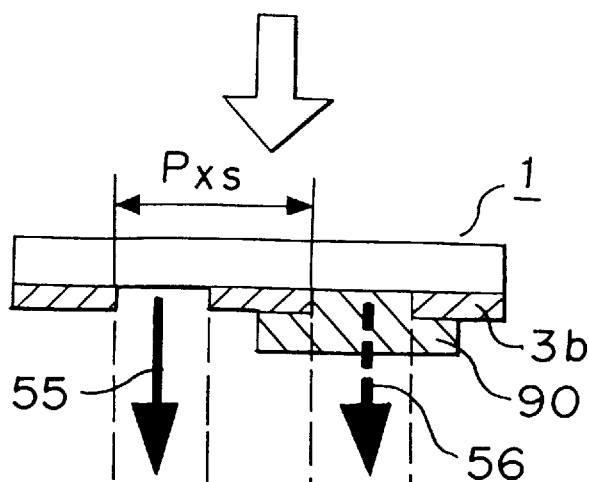
(a) INCIDENT LIGHT
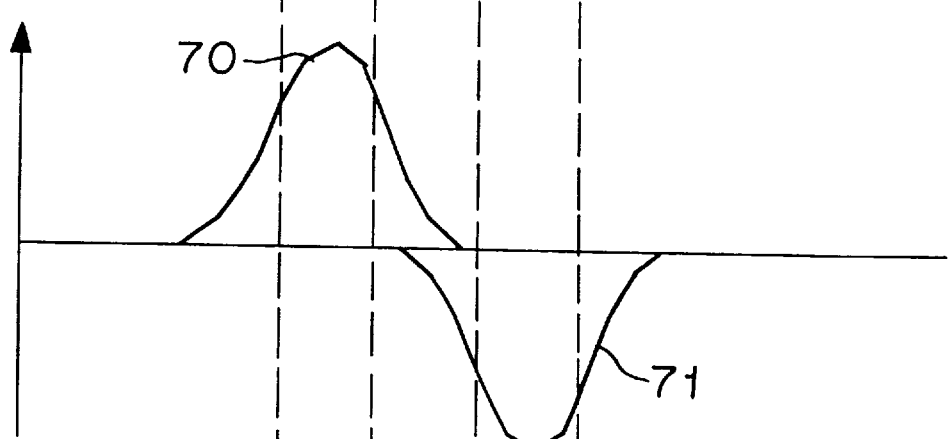
(b) LIGHT AMPLITUDE
(c) LIGHT INTENSITY ic devices, in particular a photo mask wherein light blocking regions of a mask pattern with a large pitch can be formed with a small opening to improve the depth of focus of the mask pattern.

PHOTO MASK AND METHOD FOR FABRICATING SEMICONDUCTOR DEVICES USING THE PHOTO MASK

BACKGROUND OF THE INVENTION

1. Field of the Invention

The present invention relates to a photo mask used in a photolithographic process for fabricating semiconductor devices, in particular a photo mask wherein light blocking regions of a mask pattern with a large pitch can be formed with a small opening to improve the depth of focus of the mask pattern.

2. Discussion of Background

As semiconductor devices are required to operate faster and to be formed in high integration, there has arisen a demand for provision of micro geometry to patterns. The micro geometry is required to be provided on a plane with steep steps in high relief with good precision, which requires not only good resolution but also great depth of focus. In general, a photo mask which is used in a photolithographic process has large and small patterns mingled on a single plane. The patterns vary in size from fine geometry of patterns with a small pitch such as wiring to patterns with a large pitch such as peripheral circuits. With regard to such fine geometry of patterns, there have been proposed various high resolution techniques which can improve depth of focus and resolution as stated later. However, such techniques can't give a desired effect to patterns with a large pitch, creating a problem in that it is impossible to obtain depth of focus to cope with steep steps in high relief.

Now, a photolithographic process using a conventional photo mask will be explained.

First, a transferring step for a mask pattern by a projection exposure system using a conventional circular light source method will be described.

In FIG. 15, there is shown a schematic view of the structure of a reduction-type projection exposure system according to a conventional circular light source method, which is used in a photolithographic process. Now, a step to transfer a mask pattern onto a wafer by the reduction-type projection exposure system will be explained.

Referring to FIG. 15, light which has been emitted from a circular light source 6 (the optical path of the light is indicated by solid lines) irradiates the entire plane of a photo mask 1 at an angle perpendicular thereto after the light has been condensed by a condenser lens 7. The light which has irradiated the photo mask 1 goes out in a direction depending on a pitch of a mask pattern 3 formed on the photo mask 1 after the light has been diffracted by the mask pattern. The outgoing diffracted light is converged by a projection lens 7'. The diffracted light is reduced by the projection lens 7' after the light has passed through a pupil plane 8 in the projection lens. The reduced light forms an optical image of the mask pattern 3 at a best focused position on the wafer 4. The wafer 4 has had e.g. a resist coated thereon. A patterned resist 5 is obtained so as to correspond to the mask pattern by subjecting the resist on the wafer to an ordinary photolithographic process.

Next, the relationship between the light diffracted by the photo mask and the pitch in the mask pattern will be described in detail.

In FIGS. 16 and 17, there are shown enlarged plan views of mask patterns which are arranged on the photo mask. The respective views show a pattern which has a large pitch in an x direction and a pattern which has a small pitch near to a resolution limit in the x direction. In FIGS. 18 and 19, there are shown cross-sectional views taken along the line III—III of FIG. 16 and taken along the line IV—IV of FIG. 17. In these Figures, reference numeral 1 designates the photo mask, reference numeral 2 designates a transparent substrate, reference numeral 3 designates light blocking regions which are formed by a thin film made of metal such as chromium, and reference numeral 9 designates an opening which is arranged between the light blocking regions 3.

In the mask pattern shown in FIG. 16, a plurality of rectangular light blocking regions 3a are periodically arranged at a large pitch $P_{xL}$ in the x direction and at a pitch $P_{yL}$ in a y direction. In the mask pattern shown in FIG. 17, a plurality of line arrays of light blocking regions 3b are periodically arranged in a line and space pattern with a small pitch $P_{xs}$ in the x direction.

In FIGS. 20 and 21, there are shown schematic diagrams wherein the optical paths of the light diffracted by the mask patterns of the photo mask shown in FIGS. 16 and 17 are indicated. In FIGS. 20 and 21, reference numeral 1 designates the photo mask, reference numeral 3 designates the mask patterns, reference numeral 4 designates the wafer, reference numeral 7' designates the projection lens, and reference numeral 8 designates the pupil plane. Reference numeral 50 designates zero order diffraction light, reference numerals 51 and 52 designates −first order diffraction light and +first order diffraction light, respectively, and reference numerals 53 and 54 designates −second order diffraction light and +second order diffraction light, respectively.

The light (irradiated light) which is incident on the photo mask is diffracted by the mask patterns, and an outgoing angle of each diffraction light with respect to the optical axis is determined by the pitches of the mask patterns and the order of the diffraction light. In general, when the outgoing angle of a first order diffraction light with respect to the optical axis is defined as θ, the wavelength of the light is defined as λ and the pitch of the mask patterns is defined as P, there is a relationship of $\sin\theta = \lambda/P$. The outgoing angle becomes greater as the order becomes higher.

Referring to FIG. 20, when the pattern pitch is large, the outgoing angle of the −first order diffraction light 51a and the outgoing angle θ of the +first order diffraction light 52a symmetrical thereto with respect to the optical axis become smaller, and the outgoing angles of higher order diffraction light such as the −second order diffraction light 53a and the +second order diffraction light 54a symmetrical thereto with respect to the optical axis become also smaller, so that higher order diffraction light can pass through the pupil plane 8 of the projection lens 7'. Each diffraction light which has passed through the pupil plane 8 causes interference to form an optical image at a best focused position on the wafer 4.

Referring now to FIG. 21, when the pattern-pitch is small and near to a resolution limit, the outgoing angle of each diffraction light becomes larger, causing higher order diffraction light such as the second order diffraction light 53a and 54a to deviate outside of the pupil plane 8, and allowing only the zero order diffraction light 50 and the first order diffraction light 51 and 52 to pass through the pupil plane 8.

As explained, the outgoing angle of each diffraction light varies depending on the size of a pattern pitch. As the pitch becomes larger, the optical image can be formed by multiple order diffraction light.

In FIGS. 22(a) and (b), there are shown schematic views wherein the diffraction light shown in FIGS. 20 and 21 is viewed as light source images on the pupil plane. In FIGS. 22(a) and (b), reference numeral 60 designates the light source image by the zero order diffraction light, reference numerals 61 and 62 designates the light source image by the −first order diffraction light and the light source image by the +first order diffraction light, respectively, and reference numerals 63 and 64 designates the light source image by the −second order diffraction light and the light source image by the +second order diffraction light. Reference numeral 8 designates the pupil plane.

As shown in FIGS. 22(*a*) and (*b*), the center distance between the light source image 60 by the zero order diffraction light and the light source images 61 and 62 by each first order diffraction light is equal to λ/P, and the radius of the pupil plane 8 is equal to the numerical aperture NA of the projection lens. The center of the respective light source images aligns with the optical axis of each diffraction light shown in FIGS. 20 and 21.

Referring to FIG. 22(*a*), when the pattern pitch is large, the light source images 61–64 by each diffraction light gather towards the center of pupil plane 8 so as to overlap one another as the outgoing angle of each diffraction light becomes smaller as explained with respect to FIG. 20. In the case of FIG. 22(*b*), since the pattern pitch is small, the outgoing angle of each diffraction light becomes larger, causing the respective light source images to be apart from the center of the pupil plane 8, and thereby completely deviating the light source images 63 and 64 by each second order diffraction light from the pupil plane 8.

Now, the size of a pattern pitch will be explained.

FIGS. 23(*a*)–(*c*) are schematic diagrams showing how a light source image by each diffraction light is obtained depending on a change in a pattern pitch. In FIG. 23(*a*), there are shown the light source images which are obtained when the pattern pitch is set just to he resolution limit, wherein the center of the light source images 61 and 62 by each first order diffraction light is located on an outer circumference of the pupil plane 8 and the light source images 63 and 64 by each second order diffraction light are completely deviated from the pupil plane 8. If the pattern pitch becomes smaller, each first order diffraction light 61 and 62 is also gradually deviated from the pupil plane 8, making formation of an optical image difficult. This means that at least interference between the zero order diffraction light and either one of the ±first order diffraction light is required to form an optical image with contrast in brightness. When the pattern pitch which is set to the resolution limit is defined as P, the numerical aperture of a projection exposure system is defined as NA and coherency is defined as σ, the following relationship is found:

$$P = \lambda/NA \quad (1)$$

In FIG. 23(*b*), it is shown how the light source images are obtained when the pattern pitch becomes larger than that in FIG. 23(*a*) and be near to the resolution limit, wherein the light source images by each first order diffraction light gather near to the center of the pupil plane 8 while the light source images 63 and 64 by each second order diffraction light are still deviated from the pupil plane 8. In this case, the light source images 63 and 64 by each second diffraction light are circumscribed with the outer circumference of the pupil plane 8, which shows the minimum pitch at which each second order diffraction light is completely deviated from the pupil plane. When the pitch in this case is defined as P, the following relationship is found:

$$P = 2\lambda/NA(1+\sigma) \quad (2)$$

In FIG. 23(*c*), it is shown that the pattern pitch becomes larger than that in FIG. 23(*b*), and the light source images 63 and 64 by each second order diffraction light enter the pupil plane 8 to make a little contribution to formation of the optical image. When the pattern pitch in this case is defined as P, the following relationship is found:

$$P > 2\lambda/NA(1+\sigma) \quad (3)$$

Accordingly, a small pattern pitch which is near to the resolution limit can be defined as a pitch satisfying the following formula based on the formulas (1)–(3), i.e. a pitch which prevents at least the light source images by each second diffraction light from entering the pupil plane and which can form an optical image:

$$\lambda/NA \leq P < 2\lambda/NA(1+\sigma) \quad (4)$$

A large pitch can be defined as a pitch satisfying the formula (3), i.e. a pitch which allows the second order diffraction light or more to enter the pupil plane even a little to contribute to formation of an optical image.

Now, the relationship between diffraction light and depth of focus will be described.

In general, the depth of focus shows what contrast in brightness a reproduced optical image has at defocused positions under and above a best focused position on a wafer as a reference.

For example, when the pattern pitch is small and only the zero order diffraction light 50 and the ±first order diffraction light 51 and 52 pass through the pupil plane 8 as shown in FIG. 21, such three kinds of diffraction light travel along different optical paths as zero order diffraction light 50*b*, and first order diffraction light 51*b* and 52*b*, and form an optical image on the best focus position on the wafer 4 by interference among three kinds of diffraction light (it is called 3 beams interference). At positions which are defocused upward and downward from the best focus position, the contrast in the optical image is gradually lowered depending on defocusing since the zero order diffraction light 50*b* and each first order diffraction light 51*b* and 52*b* are out of phase (the −first order diffraction light 51*b* and the +first order diffraction light 52*b* are in phase because they are symmetrical to each other with respect to the optical axis).

When the pattern pitch is large and the −second diffraction light 53 and the +second diffraction light 54 together with the zero order diffraction light 50 and the ±first order diffraction light 51 and 52 pass through the pupil plane 8 as shown in FIG. 20, the second diffraction light having a different optical path contributes to formation of the optical image to further lower the contrast in the optical image. When the pattern pitch becomes much larger, third order diffraction light, fourth order diffraction light or more are added to furthermore lower the contrast though not shown.

As explained, in a pattern with a large pitch, the depth of focus is lowered. Simulation results of the depth of focus obtained by the shown mask patterns will be indicated.

In FIGS. 24 and 25, there are shown the results which were obtained by simulating a light intensity distribution of an optical image formed by the mask pattern with a large pitch shown in FIG. 16 on best focusing and on defocusing.

The mask pattern which was used in this simulation was the same as the mask pattern shown in FIG. 16, wherein the pitch $P_{xL}$ was 1.5 μm and the opening between the light blocking regions had a spacing $D_x$ of 0.3 μm. The optical conditions were that the wavelength of exposure light was 248 nm(KrF excimer laser), the numerical aperture NA was 0.55 and the coherency σ was 0.8. When the best focused position in FIG. 24 was zero μm, the defocused value in FIG. 25 was 0.4 μm. The ordinates in both Figures represent standardized light intensity wherein 1 represents the maximum intensity and degrees of intensity are classified with tones.

When the light intensity distribution in the x direction is viewed referring to FIGS. 24 and 16, there is a gentle gradient from the weakest light intensity portion corresponding to a central portion of the light blocking region 3a having of an intensity of 0–0.1 to the strongest light intensity portion corresponding to an opening around the light blocking region. A spacing $d_1$ in the x direction between the central portion regions having the weakest intensity is about 0.5 μm. Referring now to FIGS. 25 and 16, the light intensity distribution on defocusing was characterized in that the intensity gradually become stronger from a central portion to a peripheral portion of a light blocking region as on best focusing, and that a spacing $t_2$ in the x direction between the central portion regions having the weakest intensity of 0–0.1 was about 0.8 μm, which showed that the spacing was extended in comparison with the spacing on best focusing. This means that the gradient of the intensity distribution in the x direction become gentler to make the contrast lower.

As explained, the depth of focus is extremely lowered in a mask pattern with a large pitch because an optical image is formed by a plurality of kinds of diffraction light having different optical paths (it is called multiple flux interference).

With respect to a mask pattern with a smaller pitch, there have been proposed techniques which further improve the depth of focus.

For example, "Illumination Modification of an Optical Aligner" KTI Microelectronics Seminar, pp. 217–230 (1989) has proposed a modified illumination method which is illustrated in FIG. 26 showing a schematic view of light paths of light diffracted by a photo mask. The modified illumination method is a technique which controls diffraction light caused by a pattern having a small pitch near to resolution limit to improve the depth of focus.

In this Figure, the photo mask 1 is the same as the conventional photo mask shown in FIG. 17, and has a line and space pattern 3b arranged thereon at a pitch $P_{xs}$ near to resolution limit. The other reference numerals indicate parts identical or corresponding to those indicated by the reference numerals in FIG. 21.

Referring to FIG. 26, according to the modified illumination method, the zero order diffraction light 50 from the photo mask 1 and only one of the ±first order diffraction light 51 or 52 (e.g. first order diffraction light 52) enters the pupil plane 8 of the projection lens 7, and the incident angle α of incident light is selected so as to symmetrically pass the zero order diffraction light and the first order diffraction light through the pupil plane 8 in the 3 beams interference of a pattern having a small pitch $P_{xs}$ near to the resolution limit (formation of an optical image by interference among the zero order diffraction light and the ± first order diffraction light). By this method, the number of interfering diffraction light is decreased to have so-called two luminous flux interference, and two kinds of diffraction light which form an optical image have symmetrical light paths, allowing the depth of focus to be improved without lowering the contrast in brightness of the optical image even at a defocused position.

For example, "Improving Resolution in Photolithography with a Phase Shifting Mask", IEEE Trans. Electron Devices, ED-29, pp. 1828–1836 (1982) has proposed a Attenuated phase shifting technique which is illustrated in FIGS. 27(a), (b) and (c) showing a cross-section view of a photo mask and schematic views of the intensity of the light transmitted through the mask.

In the Attenuated phase shifting technique, diffraction light caused by a pattern having a small pitch near to resolution limit is controlled to improve resolution and depth of focus as in the modified illumination method. As in the modified illumination method, the photo mask shown in FIG. 27(a) is the same as the conventional photo mask shown in FIG. 16, and the photo mask has a line and space pattern arranged thereon at a small pitch $P_{xs}$ near to the resolution limit.

In the Attenuated phase shifting technique, either one of openings adjacent to a mask pattern 3b with a small pitch on the photo mask 1 is formed with a thin transparent film 90 (see FIG. 27(a)) to shift the phase of transmission light 56 with respect to transmission light 55 adjacent thereto by 180°, thereby cancelling the amplitude of light at an overlapped portion of light amplitude 70 and light amplitude 71 of each transmission light (see FIG. 27(b)) to obtain light intensity 80 with good resolution (see FIG. 27(c)). By the 180° of shift, the zero order diffraction light from an opening and the zero order diffraction light from an adjacent opening are cancelled together to establish the two luminous flux interference due to only the ±first order diffraction light having symmetrical optical paths for formation of an optical image, and simultaneously improving depth of focus.

As another conventional measure, there has been a technique in JP-A-736174 wherein a rectangular pattern has openings formed in a stripe-like shape to improve resolution of fine geometry.

The conventional techniques as stated earlier improve the depth of focus and the resolution by controlling diffraction light caused from a mask pattern having a small pitch near to the resolution limit. However, with regard to a mask pattern having a greater pitch beyond the resolution limit, the modified illumination method can't decrease diffraction light because the optical image is formed by multiple order diffraction light, and the phase shifting method is difficult to apply because the presence of a large distance between adjoining openings prevents light from interfering.

SUMMARY OF THE INVENTION

Although the conventional techniques can offer an advantages in that the depth of focus can be improved with respect to a mask pattern with a small pitch, the conventional techniques have created a problem in that they are not effective with respect to pattern with a large pitch.

It is an object of the present invention to solve the problem, and to provide a photo mask capable of improving depth of focus with respect to a mask pattern with a large pitch. It is another object of the present invention to use the photo mask in a photolithographic process for fabrication of a semiconductor device so as to form a resist pattern with high precision, fabricating a highly reliable semiconductor device.

According to a first aspect of the present invention, there is provided a photo mask comprising:

a transparent substrate; and at least two light blocking regions;

wherein the light blocking regions are separated by a first opening and arranged at a first pitch $P_1$ satisfying the following relationship on a main surface of the transparent substrate in a first direction:

$P_1 > 2\lambda/NA(1+\sigma)$ where λ represents a wavelength of exposure light in an exposure system, NA represents a numerical aperture of the exposure system and σ represents coherency of the exposure light; and wherein the light blocking regions are formed with second openings at second pitches smaller than the first pitch in the first direction and the second openings have the exposure light transmitting therethrough, which has a weaker intensity than the exposure light transmitting through the first opening.

A ratio of the first pitch to a width of the first opening in the first direction may be not less than 3.

The main surface of the transparent substrate may be provided with a thin film made of a translucent material to decrease transmittance of the exposure light transmitting through the second openings.

The second opening may be arranged so that an average value of the second pitches in the first direction is smaller than $2\lambda/NA(1+\sigma)$ and not less than NA.

According to a second aspect of the present invention, there is provided a method for fabricating a semiconductor device comprising the steps of:

providing a resist;

exposing the resist using a photo mask comprising:
 a transparent substrate; and
 at least two light blocking regions;
 wherein the light blocking regions are separated by a first opening and arranged at a first pitch $P_1$ satisfying the following relationship on a main surface of the transparent substrate in a first direction:

$$P_1 > 2\lambda/NA(1+\sigma)$$

where λ represents a wavelength of exposure light in an exposure system, NA represents a numerical aperture of the exposure system and σ represents coherency of the exposure system; and wherein the light blocking regions are formed with second openings at second pitches smaller than the first pitch in the first direction and the second openings have the exposure light transmitting therethrough which has a weaker intensity than the exposure light transmitting through the first opening; and developing the exposed resist to form resist patterns at the first pitch.

The present invention characterized as stated above offers the following advantages;

The light blocking regions, which have the large pitch and are formed in a rectangular shape, can be formed with the second openings to shorten the pitch, decreasing diffraction light contributory to formation of an optical image so as to improve depth of focus.

The ratio of the first pitch of the rectangular light blocking regions to the width between the rectangular light blocking regions can be set to not less than 3, forming an optical image with high contrast.

The average value of the second pitches is set to be smaller than $2\lambda/NA(1+\sigma)$ and not less than NA to further improve the depth of focus.

The rectangular light blocking regions can have the opening provided with the translucent film as an interposing way to decrease transmittance of the exposure light at the opening, allowing the width of the opening to be expanded for easy preparation of a photo mask.

The photo mask can be used in a photolithographic process to form a resist pattern with high precision, thereby fabricating a highly reliable semiconductor device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a cross-sectional view of the photo mask according to the first embodiment;

FIG. 3 is a diagram showing a cross-sectional view of the photo mask according to the first embodiment and a schematic view of an intensity distribution of exposure light passing through the photo mask;

FIG. 12 is a cross-sectional view of the photo mask according to a fourth embodiment;

FIG. 13 is a diagram showing the cross-sectional view of the photo mask according to the fourth embodiment and a schematic view of an intensity distribution of transmission light passing through the photo mask;

FIG. 27 is a schematic view showing a conventional Attenuated phase shifting technique.

DETAILED DESCRIPTION OF THE PREFERRED EMBODIMENTS

Embodiment 1

A first embodiment according to the present invention will be described.

Figure 1:
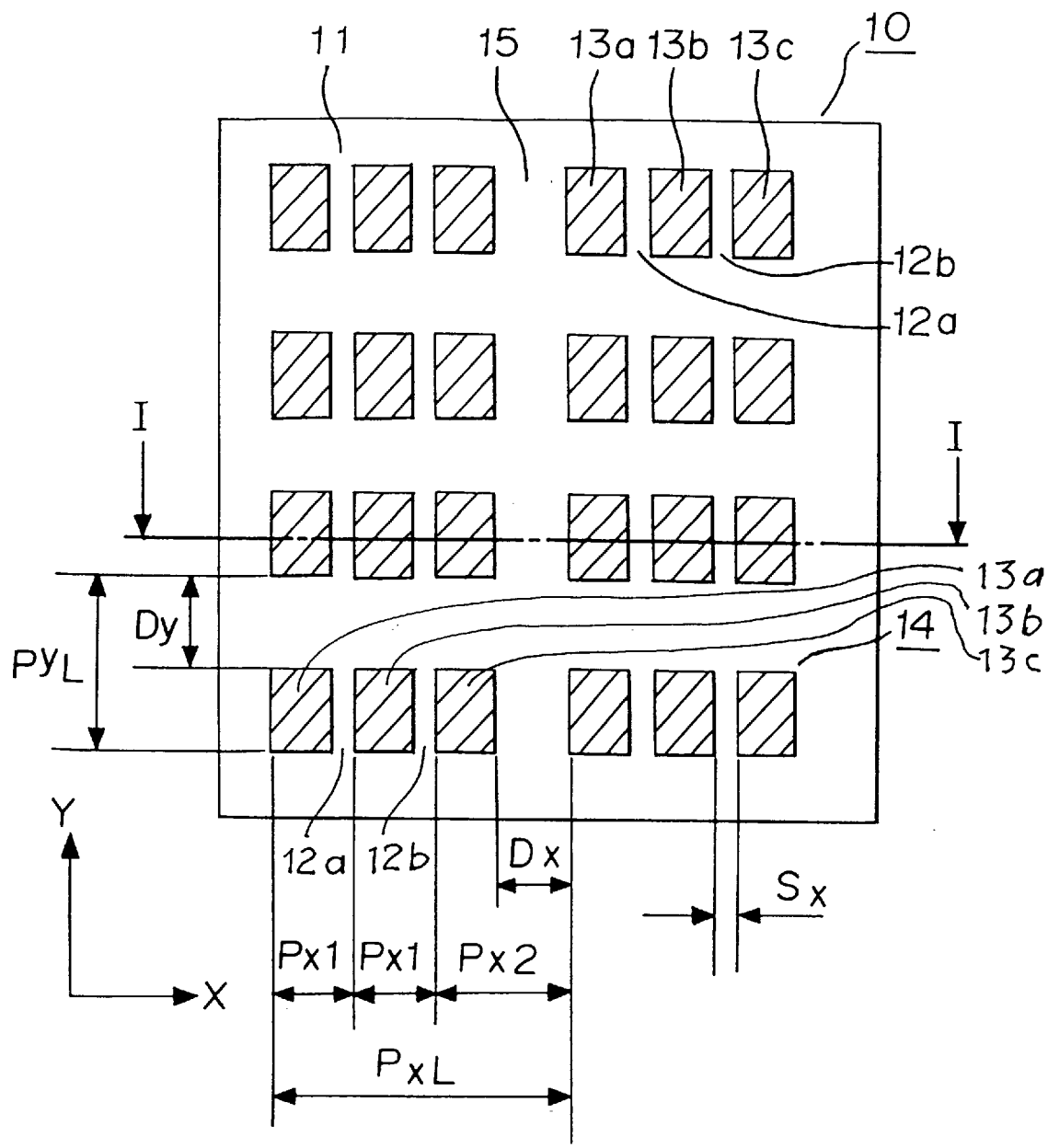
FIG. 1 is a plan view of the photo mask according to a first embodiment of the present invention.
Figure 16:
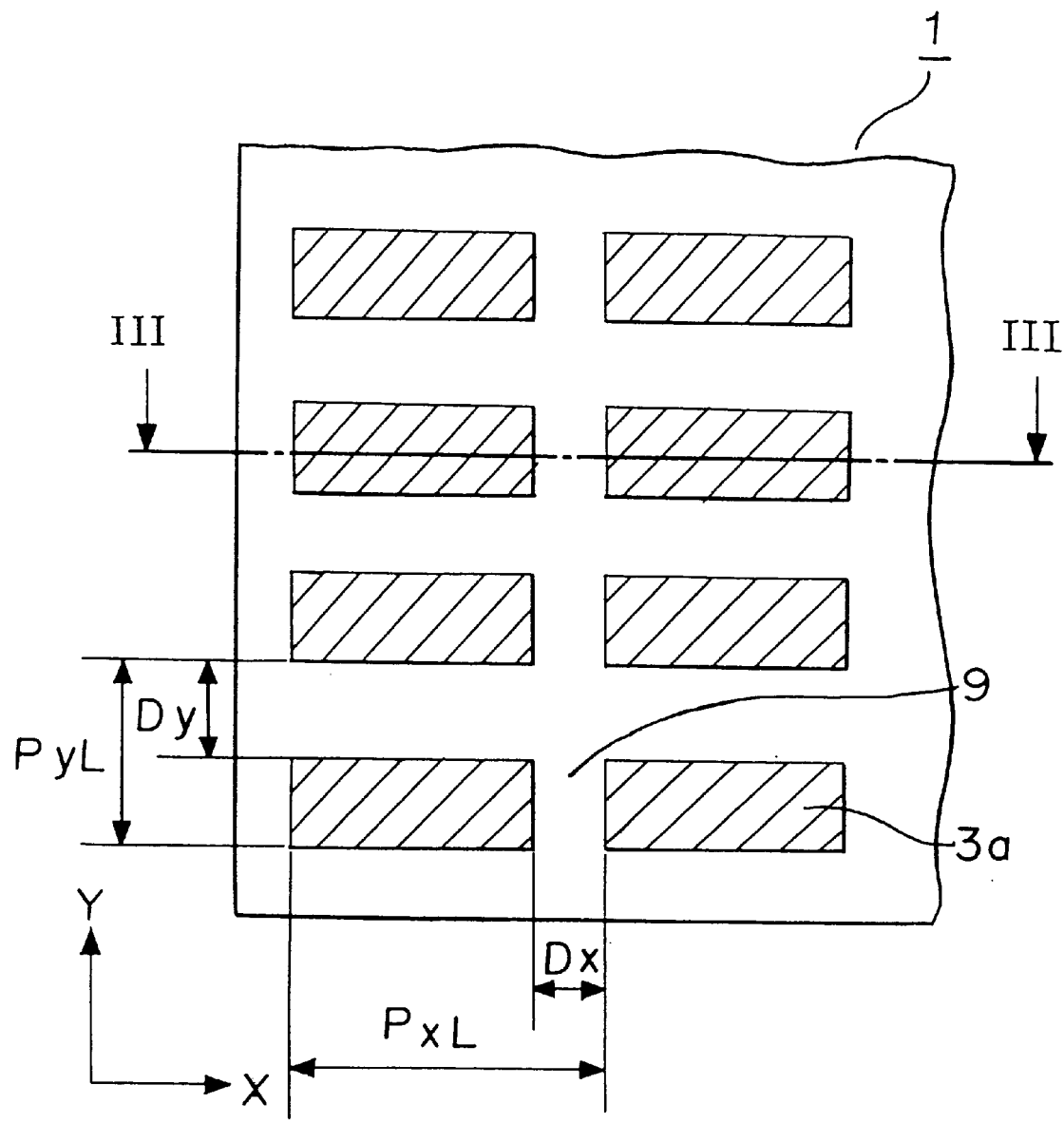
FIG. 16 is a plan view of a portion of a conventional photo mask having patterns with a large pitch.
Figure 17:
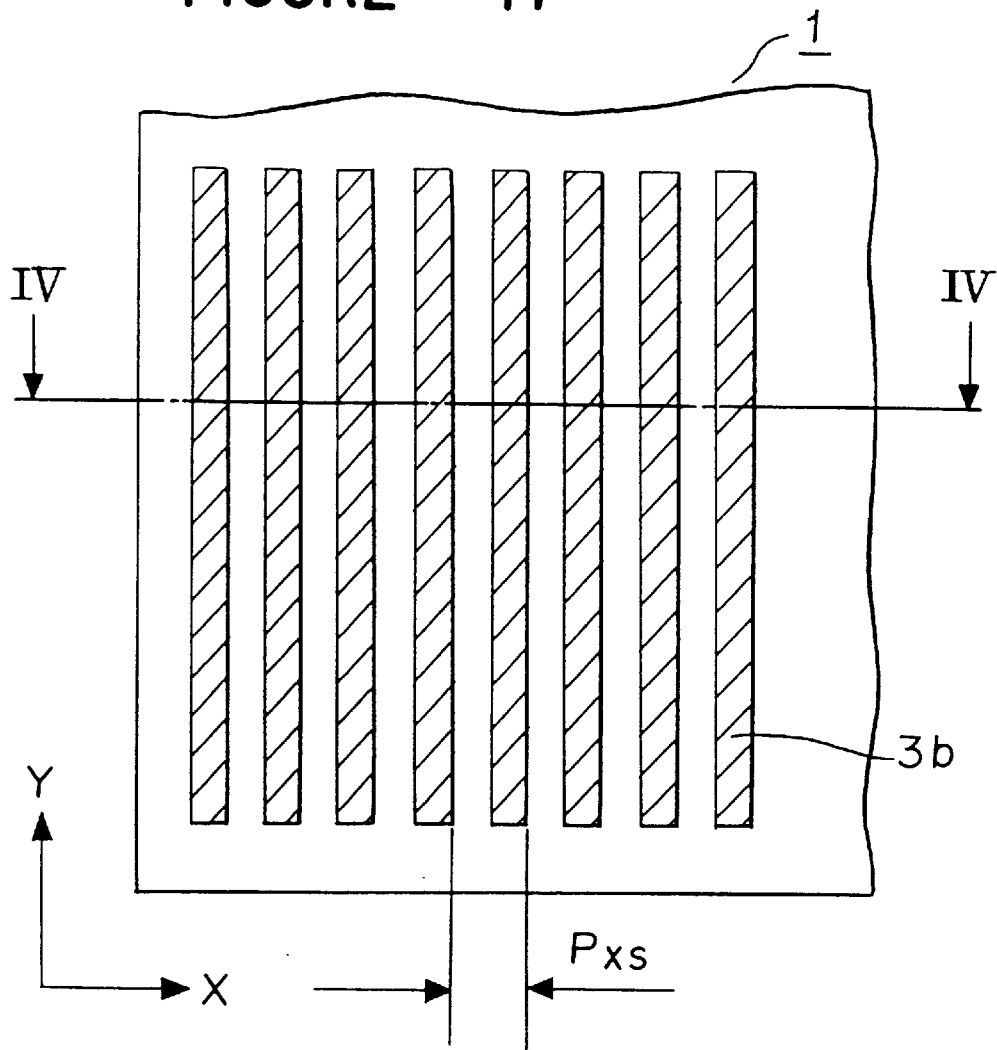
FIG. 17 is a plan view of a portion of a conventional photo mask having a pattern with a small pitch.
Figure 18:
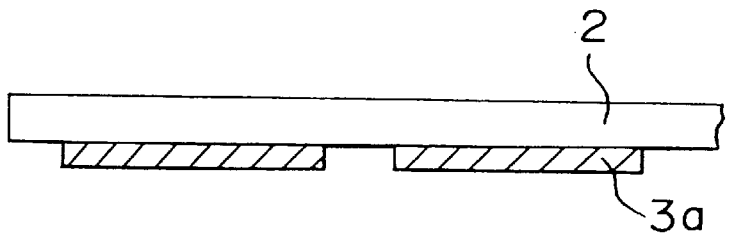
FIG. 18 is a cross-sectional view of a portion of the conventional photo mask of FIG. 16.
Figure 19:
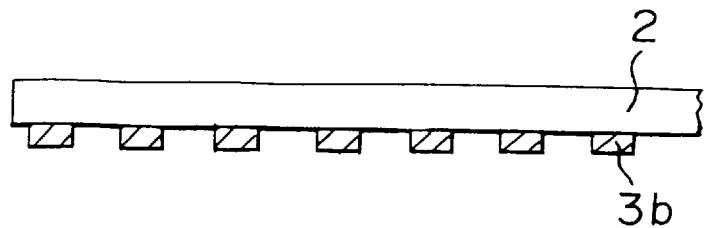
FIG. 19 is a cross-sectional view of a portion of the conventional photo mask of FIG. 17.
Figure 20:
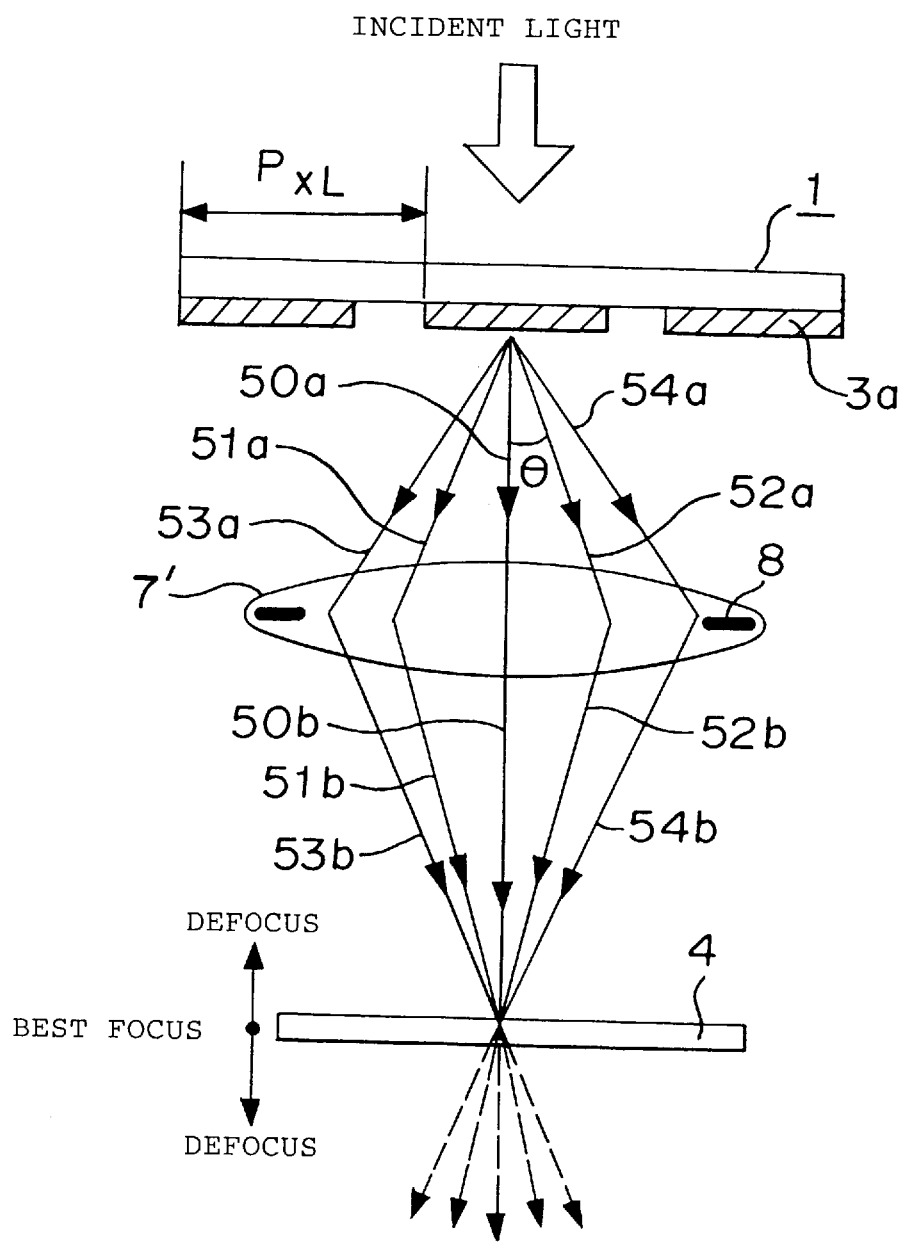
FIG. 20 is a schematic view showing optical paths of diffraction light caused by the photo mask of FIG. 16.
Figure 21:
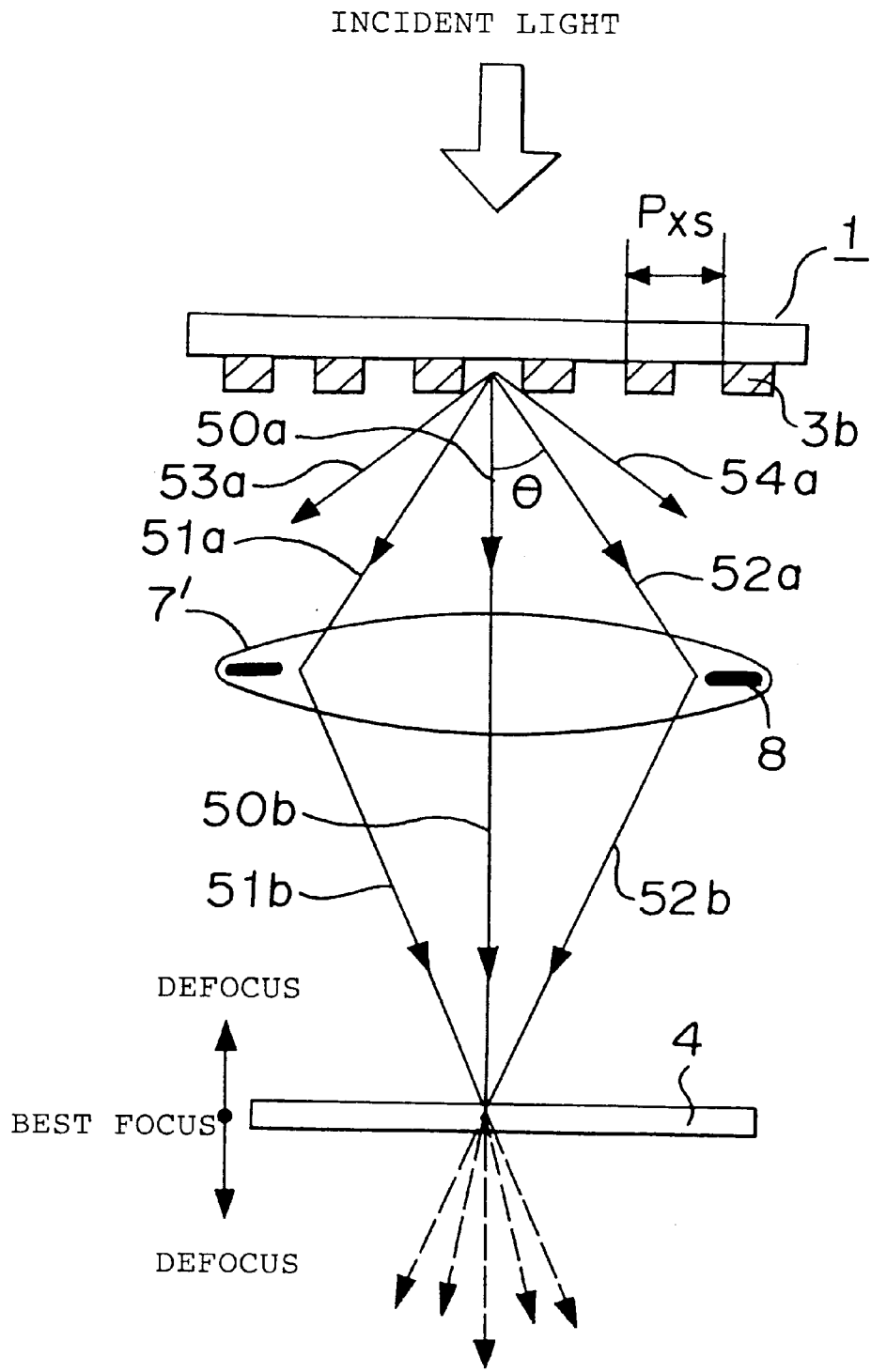
FIG. 21 is a schematic view showing optical paths of diffraction light caused by the photo mask of FIG. 17.
Figure 22:
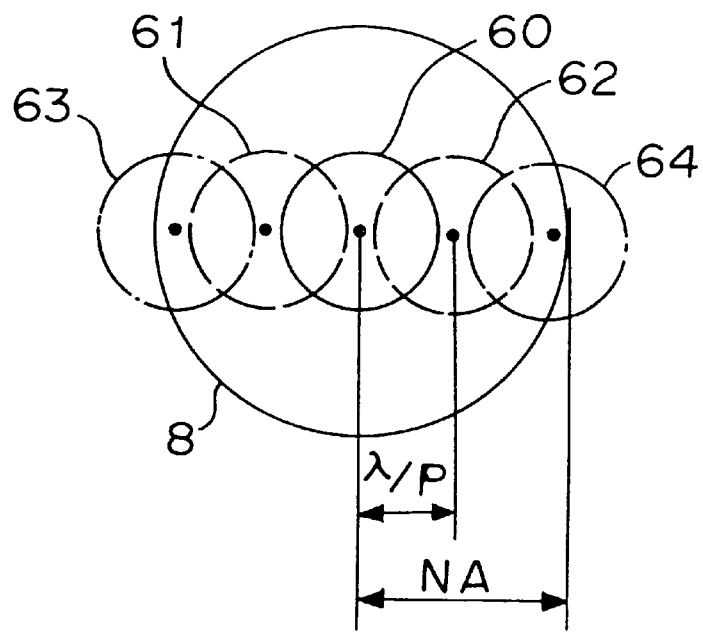
FIGS. 22(a) and (b) are schematic views showing light source images of diffraction light caused by the photo mask of FIG. 16.
Figure 22:
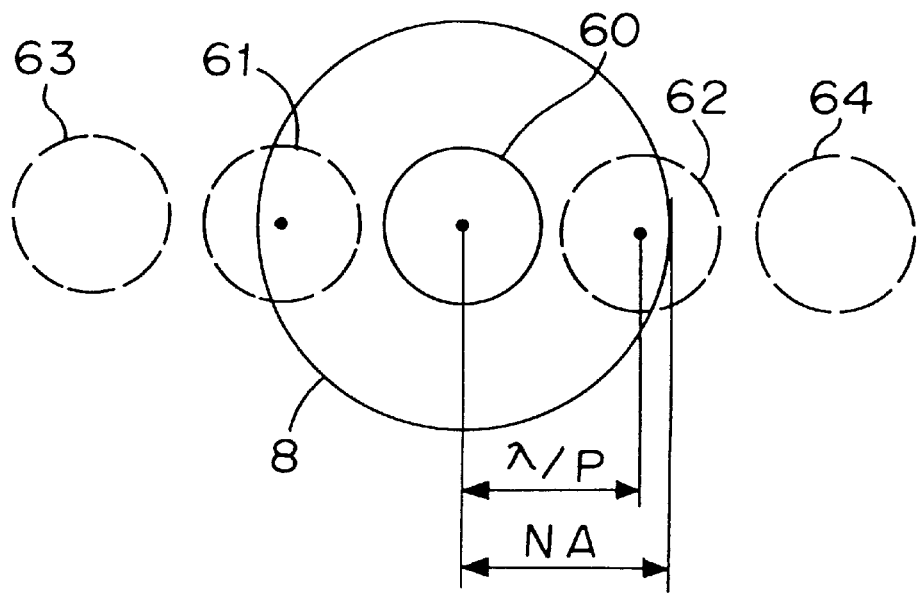
Figure 23:
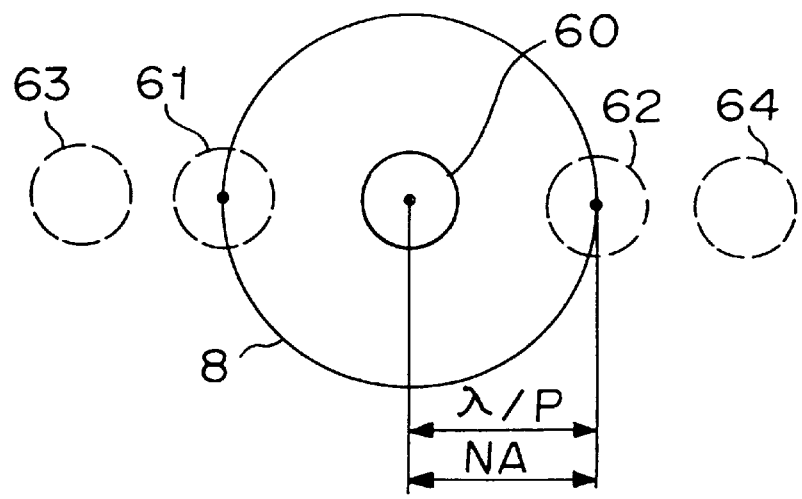
FIGS. 23(a)–(c) are schematic views showing light source images of diffraction light caused by the photo mask of FIG. 17.
Figure 23:
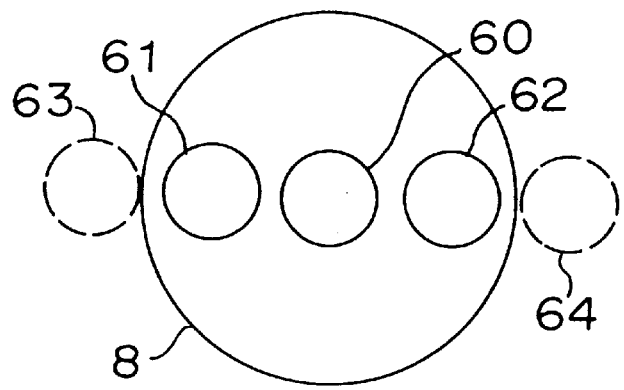
Figure 23:
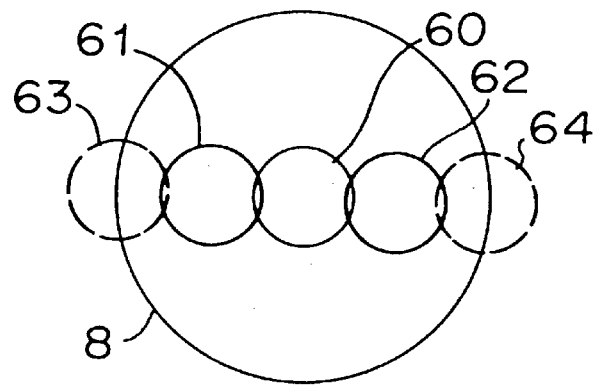
Figure 24:
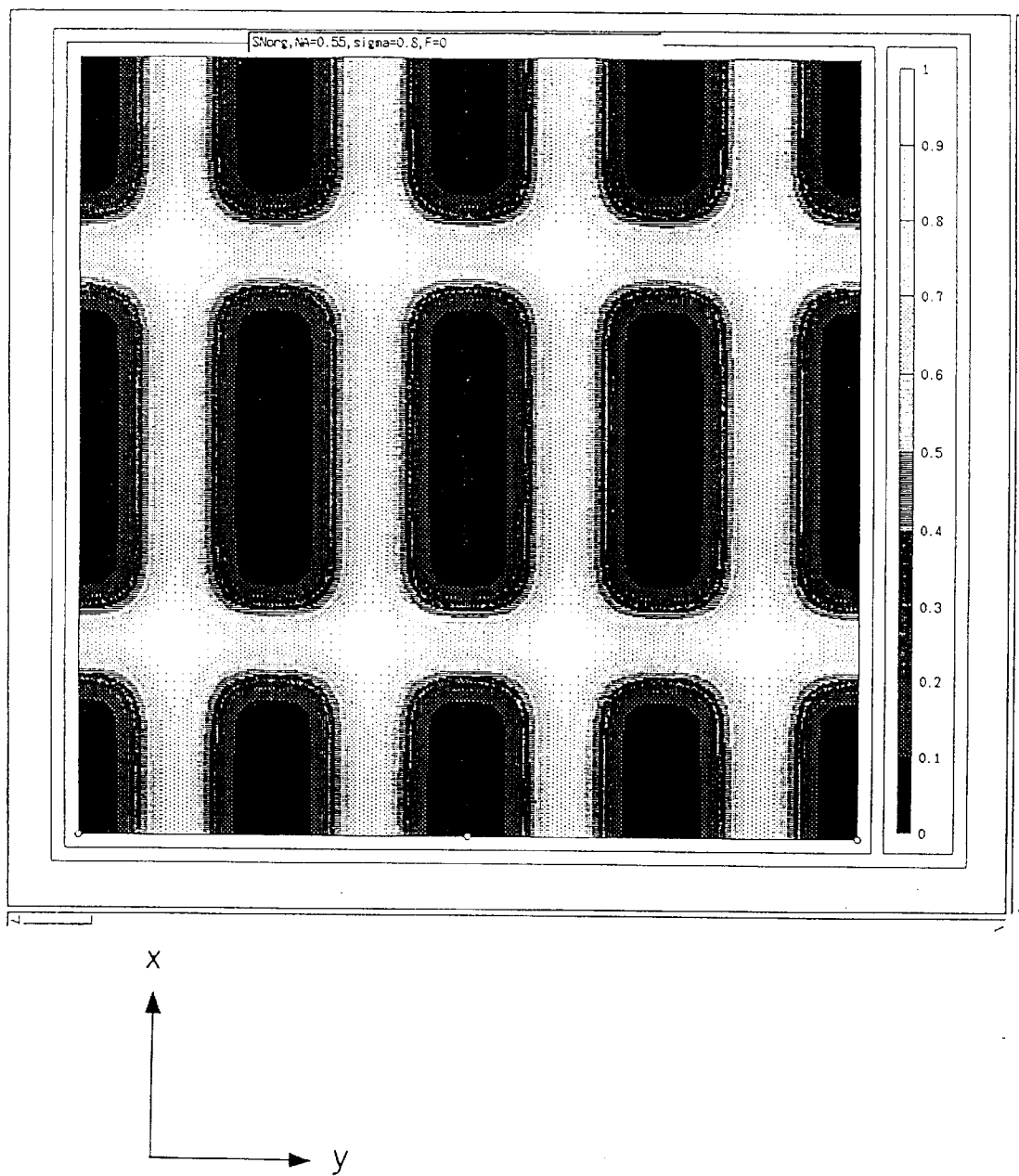
FIG. 24 is a diagram showing the results which were obtained by simulating a light intensity distribution of an optical image formed by the photo mask of FIG. 16 on best focussing.
Figure 25:
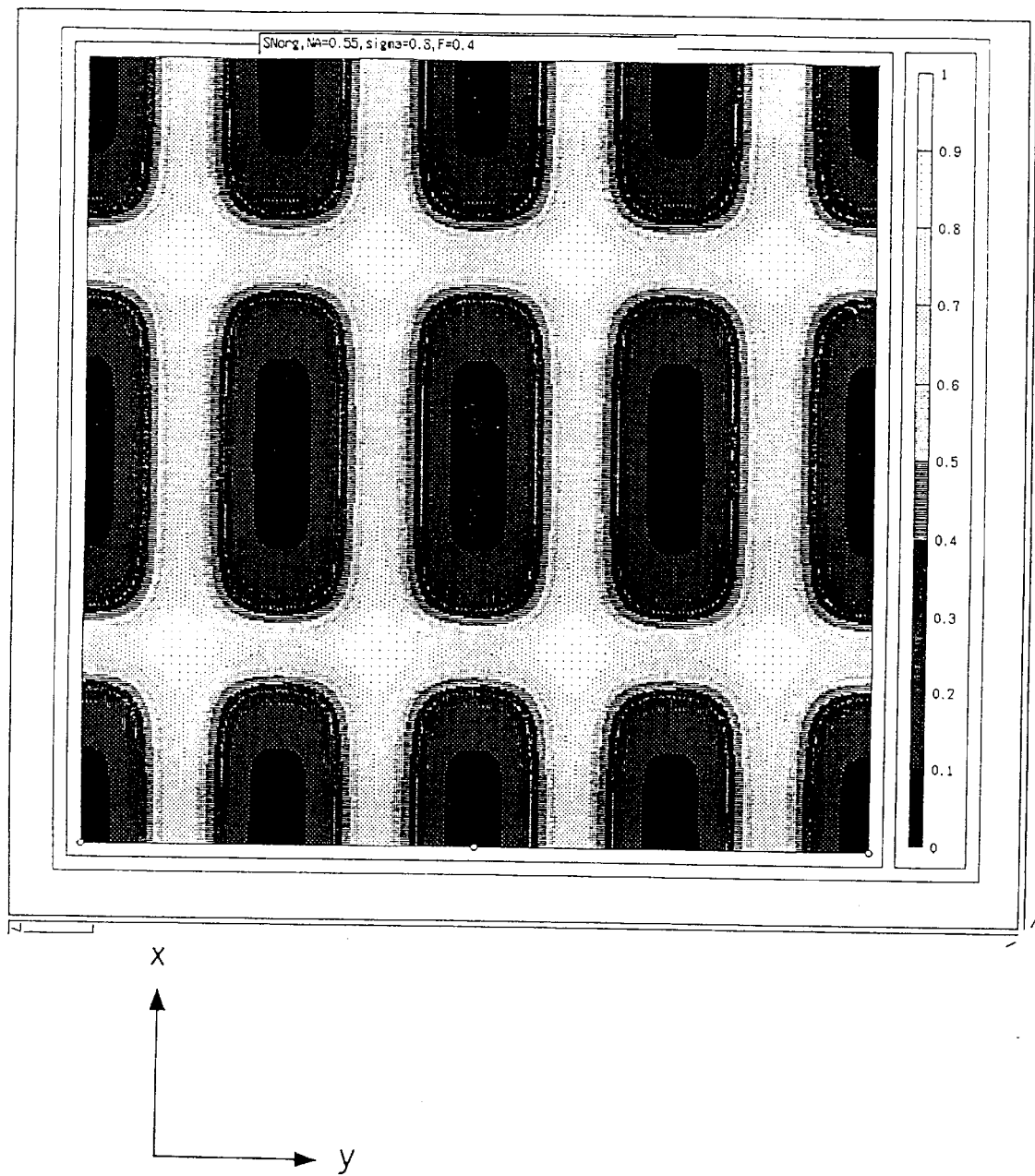
FIG. 25 is a diagram showing the results which were obtained by simulating a light intensity distribution of an optical image formed by the photo mask of FIG. 17 on defocusing.
Figure 26:
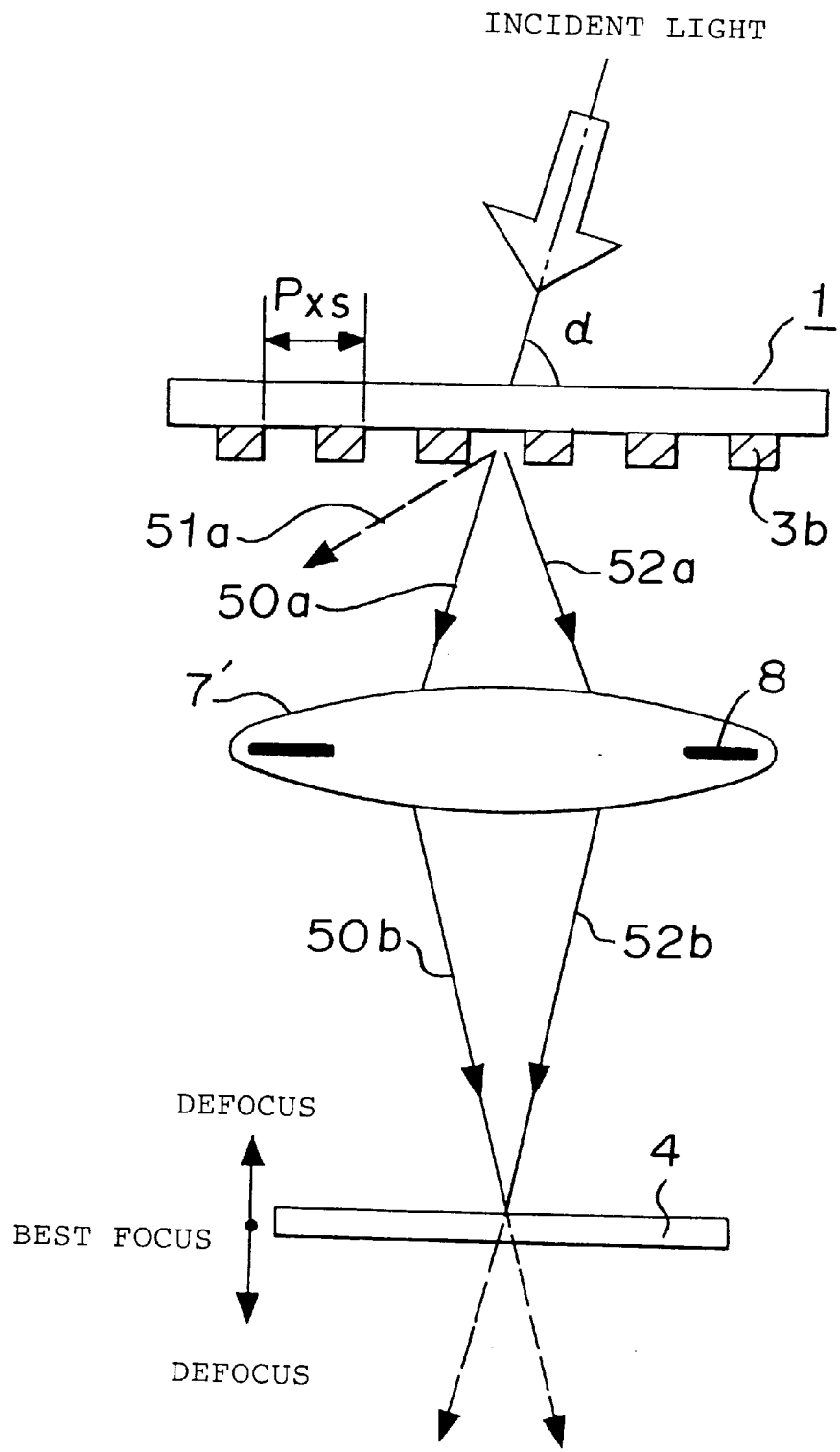
FIG. 26 is a schematic view showing a conventional modified illumination method.

In FIG. 1, there is shown a plan view of the photo mask according to the first embodiment, which is provided with a mask pattern for formation of the same resist pattern as that formed by the mask pattern of the conventional photo mask shown in FIG. 16. In FIG. 2, there is shown a cross-sectional view taken along the line I—I of FIG. 1.

In these Figures, reference numeral 10 designates the photo mask according to this embodiment, reference numeral 11 designates a transparent substrate, reference numeral 12 designates openings in a slit-like shape, reference numeral 13 designates light blocking regions which are prepared by a thin film made of metal such as chromium, reference numeral 14 designates one of light blocking patterns which are constituted by the light blocking regions 13, and reference numeral 15 designates an opening which is arranged between the light blocking patterns.

Referring to FIG. 1, the photo mask 10 includes the rectangular light blocking patterns 14 on a main surface of the transparent substrate 11, each of which is divided into the light blocking regions 13a, 13b and 13c by the slit-like shaped openings 12a and 12b as second openings, and which are arranged at pitches $P_{xL}$ and $P_{yL}$ as first pitches in an x direction as a first direction and in a y direction perpendicular to the x direction. The pitch $P_{xL}$ is large enough to satisfy a relationship of $P>2\lambda/NA(1+\sigma)$ where $\lambda$ represents a wavelength of exposure light in an exposure system, NA represents a numerical aperture and $\sigma$ represents coherency. It is preferable that a ratio of the pitch $P_{xL}$ to a width $D_x$ of the opening 15 as a first opening in the x direction is not less than 3. The presence of such ratio can improve contrast in an optical image as well.

In the photo mask thus prepared, the pitch which is viewed from exposure light incident on the mask becomes different from the inherent pitch $P_{xL}$. Specifically, the presence of the slit-like shaped openings 12 divides the original pitch $P_{xL}$ into two pitches $P_{x1}$ covering the light blocking region 13a and the opening 12a in pair and the light blocking region 13b and the opening 12b in pair, and a pitch $P_{x2}$ covering the light blocking region 13c and the width of the opening 15 between the light blocking region 13c and the light blocking region 13c of an adjacent light blocking pattern 14 as shown in FIG. 1. The pitches $P_{x1}$ and the $P_{x2}$ work as second pitches. As a result, the pitch as viewed from the exposure light is regarded as an average of the second pitches. When the average is defined as $P_{ave}$, a formula of $P_{ave}=(2p_{x1}+P_{x2})/3$ is found. The average pitch $P_{ave}$ is smaller than the original pitch $P_{xL}$. This means that the presence of the second openings can make the original pitch smaller virtually.

The slit-like shaped openings 12 may have any width $S_x$ as long as the exposure light transmitting through the openings 12 has a weaker intensity than the exposure light transmitting through the width $D_x$ of the opening 15. For example, when the exposure light is obtained from a KrF excimer laser (a wavelength: $\lambda$=248 nm), the width $S_x$ may be about 0.1 nm which is lower than the resolution limit.

In FIG. 3, there are shown a cross-sectional view of the photo mask taken along the line I—I of FIG. 1 and a schematic view of an intensity distribution of an optical image formed by the exposure light transmitted through the photo mask. In FIG. 3, reference numeral 81 designates intensity of the light passed through the opening 15, and reference numeral 82 designates intensity of the light passed through a slit-like shaped opening 12a.

Normally, a resist pattern is formed by exposing a resist on a wafer by exposure light and using a solubility difference between an exposed portion and a non-exposed portion with respect to developing solution. The slit-like shaped openings 12 occupy portions which should be originally prevented from being exposed. As shown in FIG. 3, the openings 12 are formed to have such a width that little exposure light passes therethrough. The presence of the openings has no effect on formation of the resist pattern because the light strength 82 is very weak and negligible in comparison with the intensity 81 of the exposure light irradiated to a portion to be exposed. The pattern which is constituted by the light blocking regions 13a, 13b and 13c divided by the slit-like shaped openings 12 can be regarded as a single light blocking region. Even if there is not a greater difference between the intensity of the light passing through the opening 15 and the intensity of the light passing through the openings 12, an adverse effect on formation of a resist pattern can be eliminated by selecting a suitable resist that can not have the adverse effect on the resist pattern even in case of a small difference in intensity.

The number and arrangement of the slit-like shaped openings may be set depending on a pattern arrangement or optical conditions so that second order diffraction light or higher order diffraction light is prevented from passing through a pupil plane, that is to say the average pitch becomes a small pitch near to the resolution limit as explained later on. For example, an original light blocking region may be divided into equal portions by two slit-like shaped openings 12a and 12b as in the photo mask shown in FIG. 1.

Now, the diffraction light caused by the photo mask 10 in a projection exposure system using a circular light source method will be described.

Figure 4:
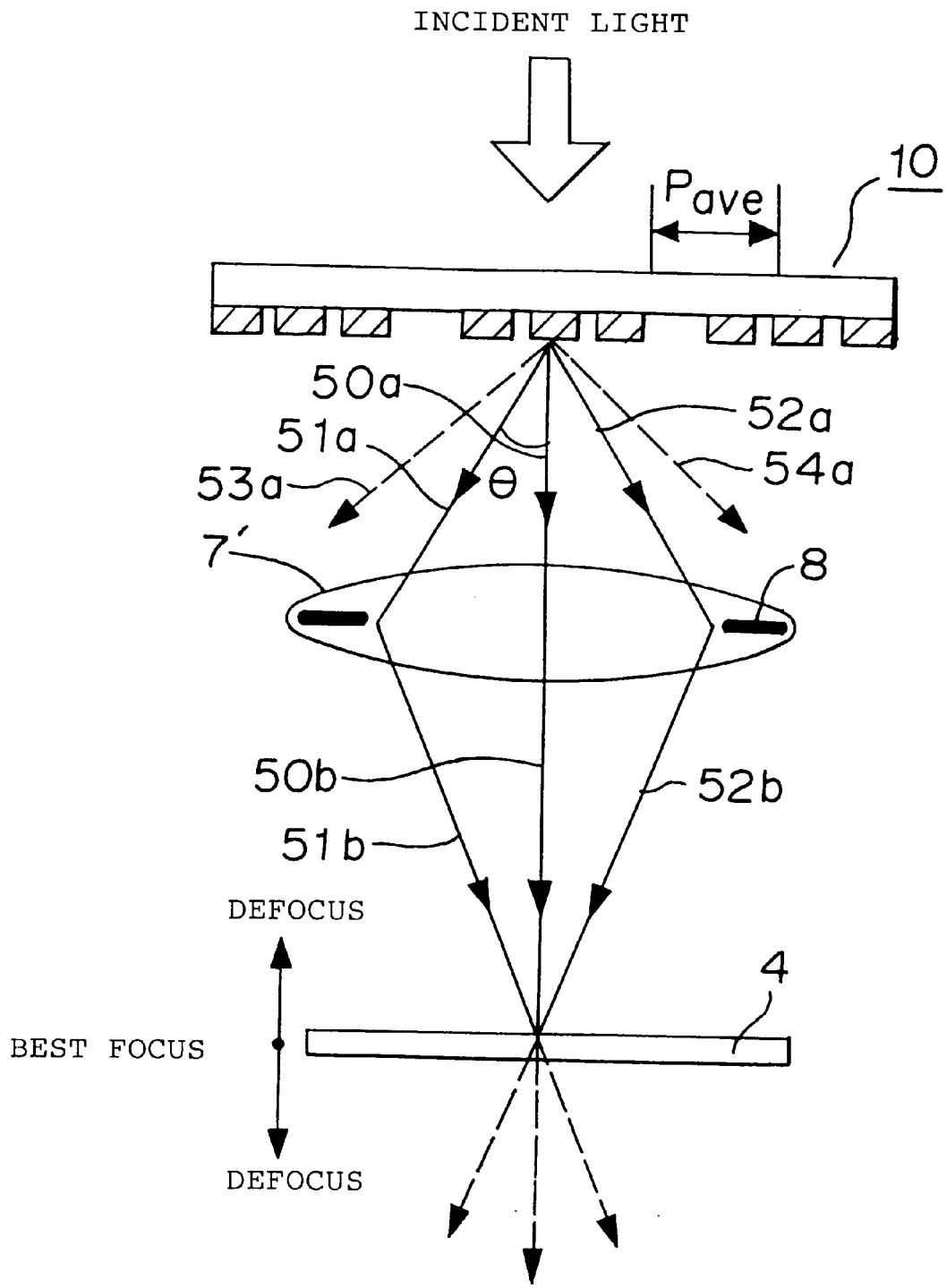
FIG. 4 is a schematic view showing optical paths of diffraction light in the first embodiment.

In FIG. 4, there is shown a schematic view of optical paths of the diffraction light caused by the photo mask. In this Figure, reference numeral 10 designates the photo mask, reference numeral 50 designates zero order diffraction light, reference numerals 51 and 52 indicate −first order diffraction light and +first order diffraction light, respectively, reference numerals 53 and 54 designate −second order diffraction light and +second order diffraction light, respectively, reference numeral 7 designates a projection lens of the projection exposure system, reference numeral 8 designates a pupil plane of the projection lens, and reference numeral 4 designates a wafer.

As stated earlier, the photo mask is formed so that the average pitch of a mask pattern is set to be a small pitch near to the resolution limit. With regard to the light diffracted by the mask pattern, only the zero order diffraction light 50a and the ±first order diffraction light 51a and 52a pass through the pupil plane 8, and high order diffraction light such as the second diffraction light 53a and 54a deviates outside of the pupil plane 8 and is prevented from passing through the pupil plane as shown in FIG. 4.

Figure 5:
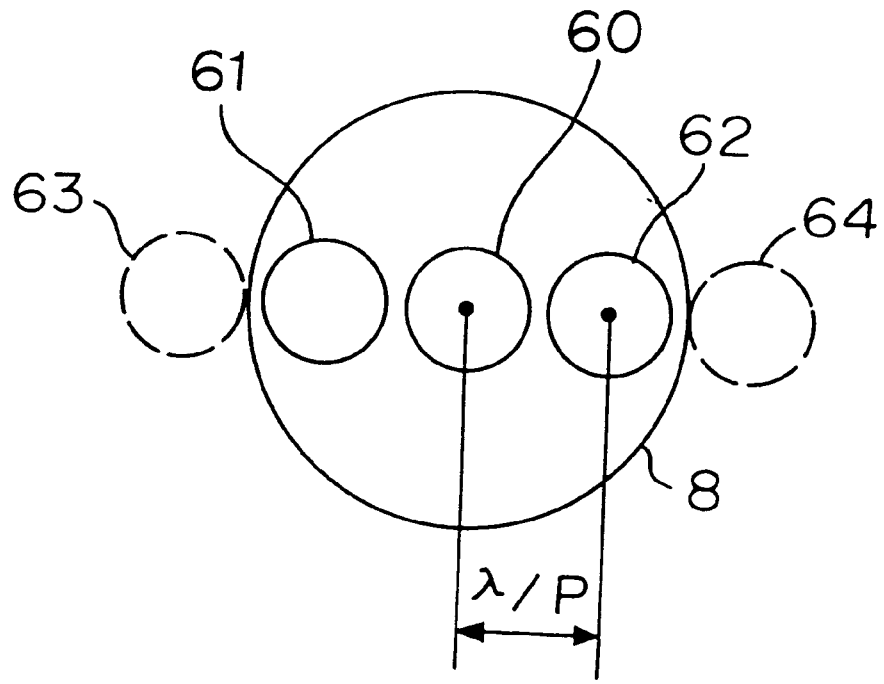
FIGS. 5(a) and (b) are schematic views showing light source images formed by the diffraction light in the first embodiment.
Figure 5:
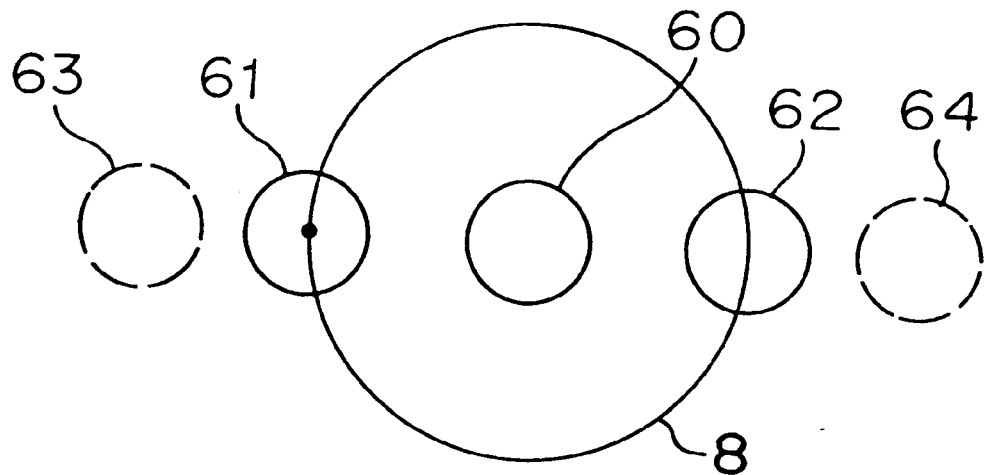

In FIGS. 5(a) and (b), there are shown schematic views of the state of light source images on the pupil plane 8, which are formed by the diffraction light shown in FIG. 4, and wherein the average pitch is set in two different ways. In FIG. 5, reference numeral 60 designates a light source image formed by the zero order diffraction light, reference numerals 61 and 62 designate light source images formed by the −first order diffraction light and the +first order diffraction light, respectively, reference numerals 63 and 64 designate light surface images formed by the −second order diffraction light and the +second order diffraction light respectively, and reference numeral 8 designates the pupil plane.

In FIG. 5(a), there are shown the light source images which are obtained when the average pitch $P_{ave}$ is set to satisfy a formula of $P_{ave}=2\lambda/NA(1+\sigma)$ where $\lambda$ represents a wavelength of exposure light, NA represent a numerical aperture of the projection exposure system and $\sigma$ represents coherency of the exposure light. In FIG. 5(b), there are shown the light source images which are obtained when the pitch is just set to the resolution limit, and wherein the average pitch $P_{ave}$ satisfies a formula of $P_{ave}=\lambda/NA$. As can see from these Figures, the pitch in each case is set so that the light source image formed by the second order diffraction light or a light source image formed by higher order diffraction light is prevented from coming in the pupil plane.

The average pitch shown in FIG. 5(a) is the maximum acceptable value. If the average is set to be larger than the maximum acceptable value, the light source images 63 and 64 by the second order diffraction light come in the pupil plane 8. The average pitch shown in FIG. 5(b) is the minimum acceptable value. If the average pitch is set to be smaller than the minimum acceptable value, the light source images 61 and 62 by the first order diffraction light are also deviated outside of the pupil plane to gradually make formation of an optical image difficult.

In other words, if an average pitch which are provided by the second openings is defined as $P_{ave}$, the pitch $P_{ave}$ is preferably in a range identified by the following formula;

$$\lambda/NA \leq P_{ave} < 2\lambda/NA(1+\sigma) \quad (5)$$

The pitch shown in this formula is the same as the pitch near to the resolution limit shown in the formula (4).

Next, simulation results of the depth of focus obtained by the photo mask according to the first embodiment will be explained.

Figure 6:
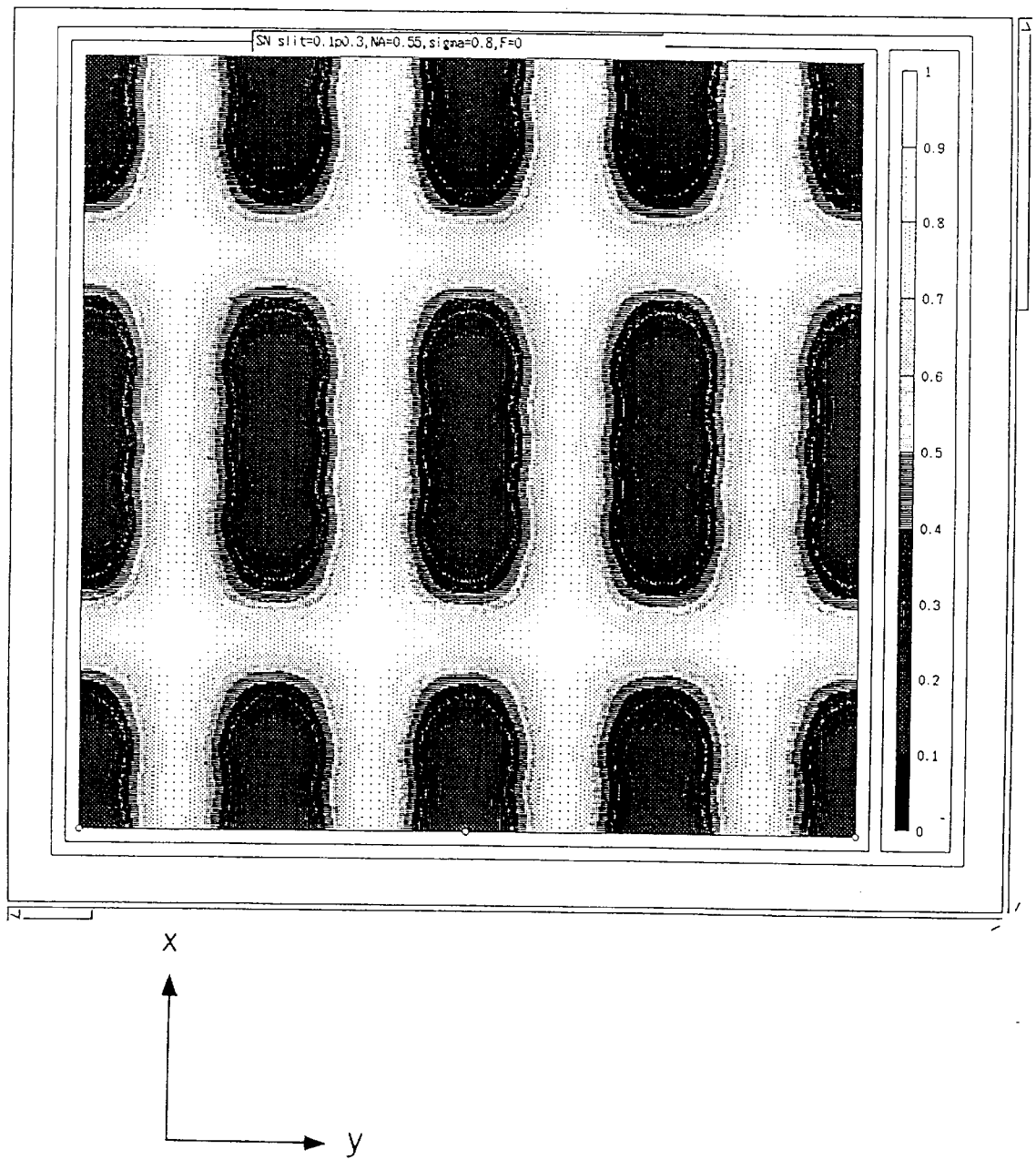
FIG. 6 is a light intensity distribution diagram showing the results which were obtained by simulating a light intensity distribution of an optical image on best focusing in the first embodiment.
Figure 7:
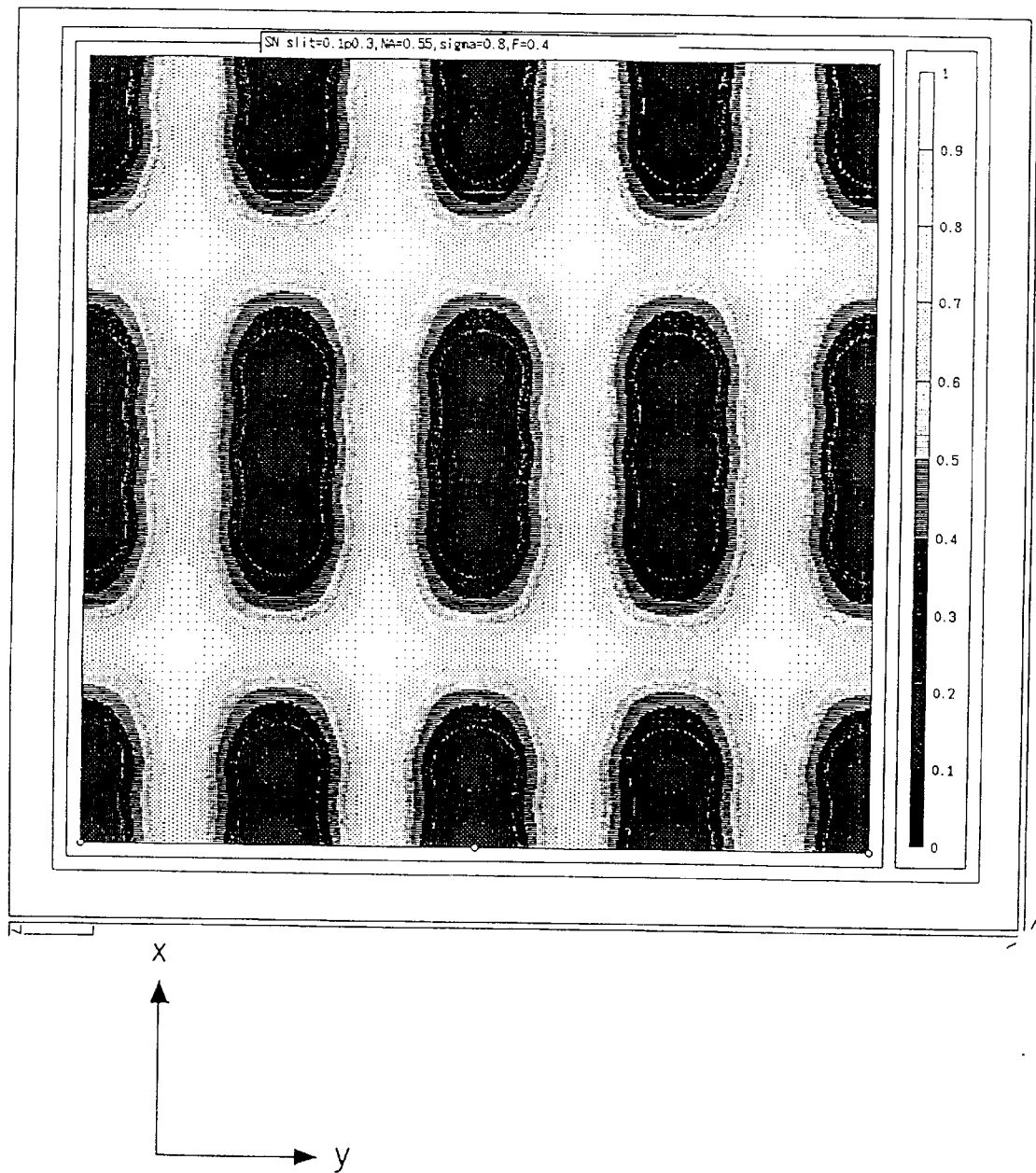
FIG. 7 is a light intensity distribution diagram which were obtained by simulating a light intensity distribution of an optical image on defocusing in the first embodiment.

In FIGS. 6 and 7, there are shown the results which were obtained by simulating a light intensity distribution of an optical image on best focusing and on defocusing, using the photo mask according to this embodiment.

The mask pattern used in the simulation was the same as the mask pattern shown in FIG. 1. The width $S_x$ of the slit-like shaped openings 12 was 0.1 μm, the pitch $P_{xL}$ was 1.5 μm, the spacing $D_x$ of the opening between adjacent light blocking regions was 0.3 μm, and the pitches $P_{x1}$ and $P_{x2}$ were 0.4 μm and 0.7 μm, respectively (this means that the average value of the pitches was 0.5 μm). The optical conditions were that the wavelength of exposure light was 248 nm (KrF excimer laser), the numerical number NA was 0.55 and the coherency σ was 0.8. When the best focused position in FIG. 6 was 0 μm, the defocusing value in FIG. 7 was 0.4 μm. In both Figures, the ordinates represent standardized light intensity wherein 1 represents the maximum intensity and degrees of intensity are classified with tones.

When the light intensity distribution in the x direction is viewed referring to FIGS. 6 and 1, a central portion corresponding to the light blocking region 3a had an intensity of 0.1–0.2 as the weakest light intensity, and the intensity gradually become stronger from the central portion toward the openings around the light blocking region. Spacing $d_3$ in the x direction between adjacent central portion regions having the weakest intensity was about 0.6 μm.

Referring now to FIGS. 7 and 1, the intensity distribution on defocusing was such that the intensity gradually become stronger from a central portion toward a peripheral portion as on best focusing though a central portion having an intensity of 0.1–0.2 has the weakest intensity was divided into three circular regions by the provision of the slit-like shaped openings. Spacing $d_4$ between adjacent outer most circular regions was about 0.7 μm. This shows that the gradient of the intensity distribution from the circular regions toward a peripheral portion in the x direction make little change in comparison with best focusing. This means that the depth of focus was able to be improved without almost lowering contrast in an optical image even on defocusing.

Now, a method for preparing the photo mask according to this embodiment will be explained.

In FIGS. 8(a)–(d), there are shown cross-sectional views of fabrication steps for the photo mask. In these Figures, reference numeral 11 designates the transparent substrate, reference numeral 13 designates a light blocking region, reference numeral 16 designates a thin film which is made of metal such as chromium, and reference numeral 17 designates as a resist pattern.

Figure 8:
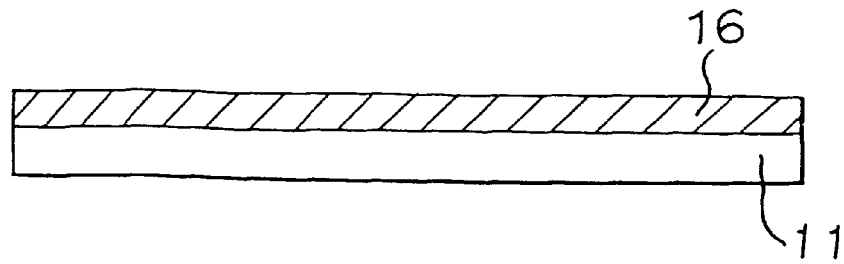
FIGS. 8(a)–(d) are cross-sectional views showing fabrication steps of the photo mask according to the first embodiment.
Figure 8:
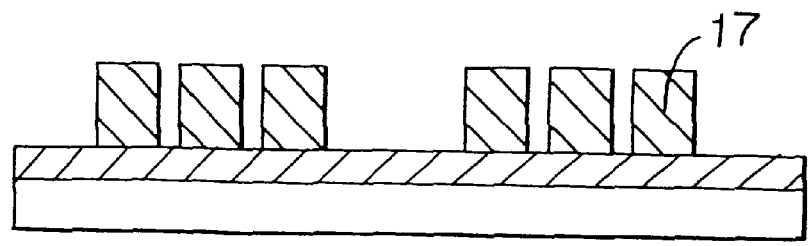
Figure 8:
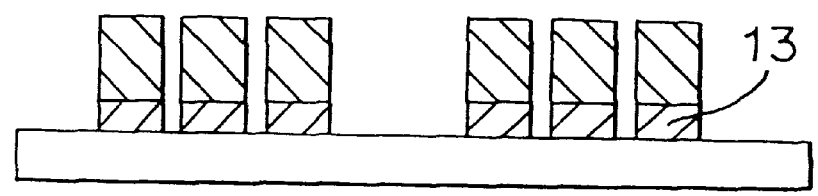
Figure 8:
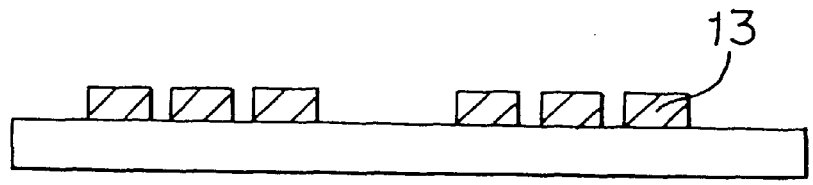

As shown in FIG. 8(a), the thin metallic film 16 such as chromium is deposited on the transparent substrate 11 by sputtering or CVD (Chemical Vapor Deposition). Next, as shown in FIG. 8(b), a resist is coated on the thin film 16, a desired pattern is transferred on the resist by an exposure system such as an EB (electron beam) writer, and then the exposed resist is developed to form the resist pattern in a desired shape. Next, as shown in FIG. 8(c), the thin film 16 is dry-etched to be patterned using the resist pattern 17 as a mask. After that, the resist is eliminated to provide the light blocking region 13 made of the thin film 16 with a desired mask pattern as shown in FIG. 8(b).

As stated earlier, the photo mask according to the first embodiment allows only the zero order diffraction light and the ±first order diffraction light to pass through the pupil plane and deviates the second order diffraction light or higher order diffraction light outside of the pupil plane by providing the slit-like shaped openings in the rectangular light blocking regions with a large pitch as an original pitch to make the original pitch smaller virtually. By such arrangement, multiple beams interference including the second order diffraction light or higher order diffraction light can be modified to 3 beams interference, offering an advantage in that depth of focus can be improved even in a rectangular pattern with a large pitch.

Next, a method for fabricating a semiconductor device using this photo mask will be explained. Semiconductor devices such as ULSIs (Ultra Large Scale Integrations) are normally fabricated using a wafer process. The wafer process includes various kinds of steps wherein a series of steps are repeated many times to form elements on a wafer. Such a series of steps will be explained.

First, a thin film is deposited on the entire surface of a wafer. In this step, the thin film, which is made of silicon or aluminum is deposited by CVD or sputtering. Next, the thin film is processed so as to have a desired pattern. This process is broadly classified into two steps: a photolithographic step and an etching step. The photolithographic step forms a resist pattern which works as a mask for etching the thin film. The photolithographic step includes a first step to coat a resist on the entire surface of the wafer, a second step to expose the resist by an exposure system using a photo mask on which a light blocking film is formed in a desired pattern, and a third step to develop the exposed resist. By the photolithographic step, the desired pattern is transferred onto the resist to obtain a desired resist pattern. After the thin film is etched by an etching system using the resist pattern as a mask, the resist is eliminated to obtain a desired pattern made of the thin film. Semiconductor devices are fabricated by repeating such process many times and layering different patterns.

The photolithographic step is the most important among such a series of process, and the point is that a resist pattern is formed with high precision. In particular, the problem of depth of focus in the exposure step is the most important for formation of a resist pattern on steep steps required for high integration. Use of the photo mask according to this embodiment in the exposure step can offer an advance in that a resist pattern can be obtained with high precision, leading to provision of a highly reliable semiconductor device.

Embodiment 2

Figure 9:
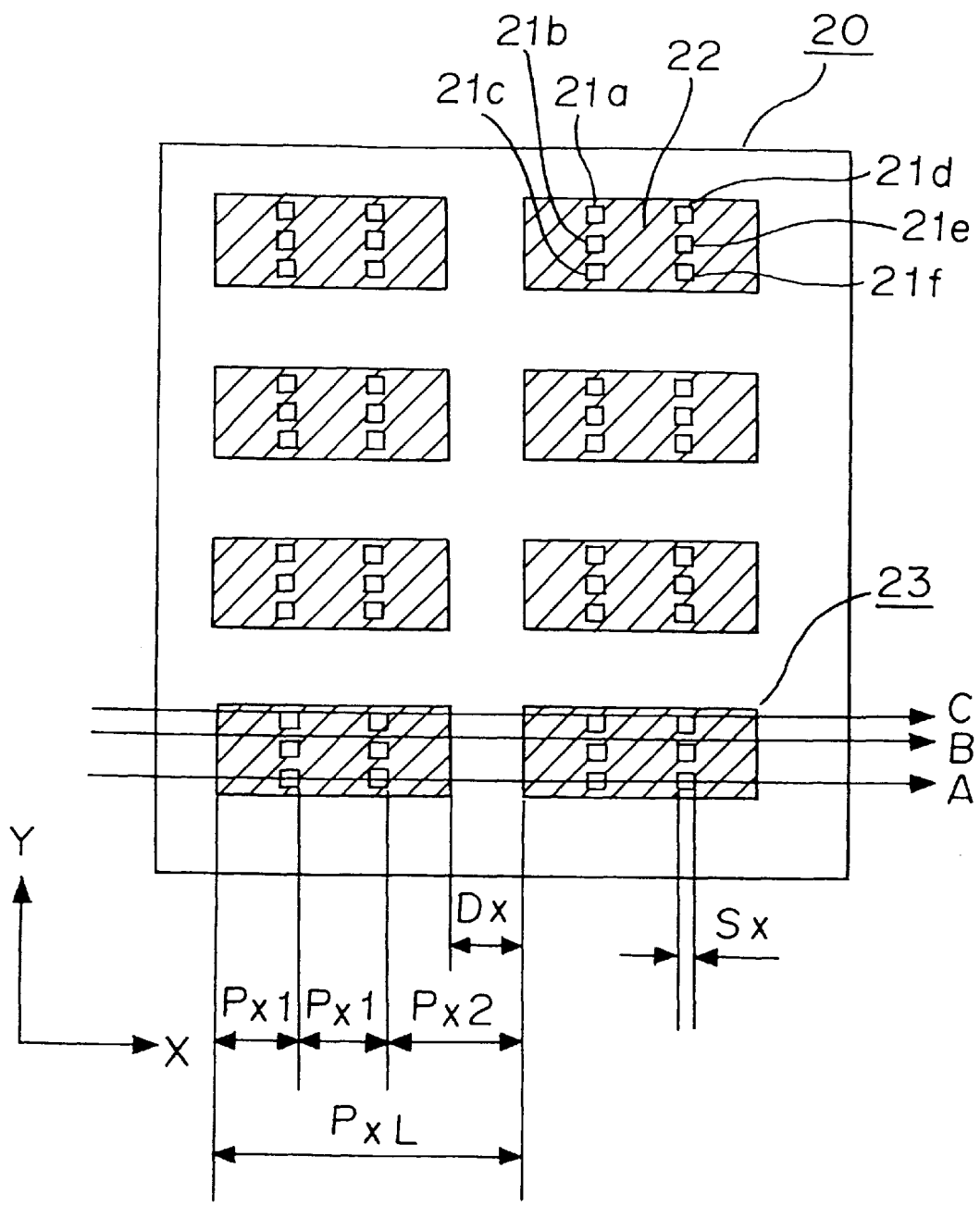
FIG. 9 is a plan view of the photo mask according to a second embodiment of the present invention.

Although the slit-like shaped openings are provided to make the original pitch smaller virtually in the first embodiment, a plurality of rectangular openings are provided to make the original pitch smaller virtually in a second embodiment. In FIG. 9, there is shown a plan view of the photo mask according to the second embodiment. In FIG. 9, reference numeral 20 designates the photo mask according to this embodiment, reference numeral 21 designates the rectangular openings, reference numeral 22 designates a light blocking region, and reference numeral 23 designates a light blocking pattern.

In the photo mask according to this embodiment, the slit-like shaped openings according to the first embodiment are replaced by the rectangular openings 21 which have the same width $S_x$ as the slit-like shaped openings as second openings as shown in FIG. 9. For example, the pitch on an arrowed line A passing on the rectangular openings has an average of pitches $P_{x1}$ and $P_{x2}$ as second pitches as in the first embodiment, thereby providing a smaller pitch than the original pitch $P_{xL}$. On the other hand, the pitch on an arrowed line B passing between the rectangular openings or the pitch on an arrowed line C passing between the outer most rectangular openings and an edge of the light blocking region 22 remain unchanged in comparison with the original pitch $P_{xL}$. An adverse effect by the absence of the rectangular openings in these portions can be neglected by setting the width of the light blocking region between adjacent rectangular openings to such a small value that resolution by exposure light becomes impossible.

The area and the arrangement of these rectangular openings may be suitably set depending on a pattern arrangement or optical conditions.

Such a pattern structure can offer an advantage in that the pitch can be smaller to improve depth of focus as in the first embodiment.

The use of the photo mask according to this embodiment can be applied to a method for fabricating semiconductor devices, offering an advantage in that highly reliable semiconductor devices can be produced as in the first embodiment.

Embodiment 3

Although the pitch only in the x direction is considered in the first embodiment, a third embodiment also provides openings with respect to the pitch in the y direction to make the pitch smaller when the light blocking regions have a rectangular pattern with large pitches not only in the x direction but also in the y direction.

Figure 10:
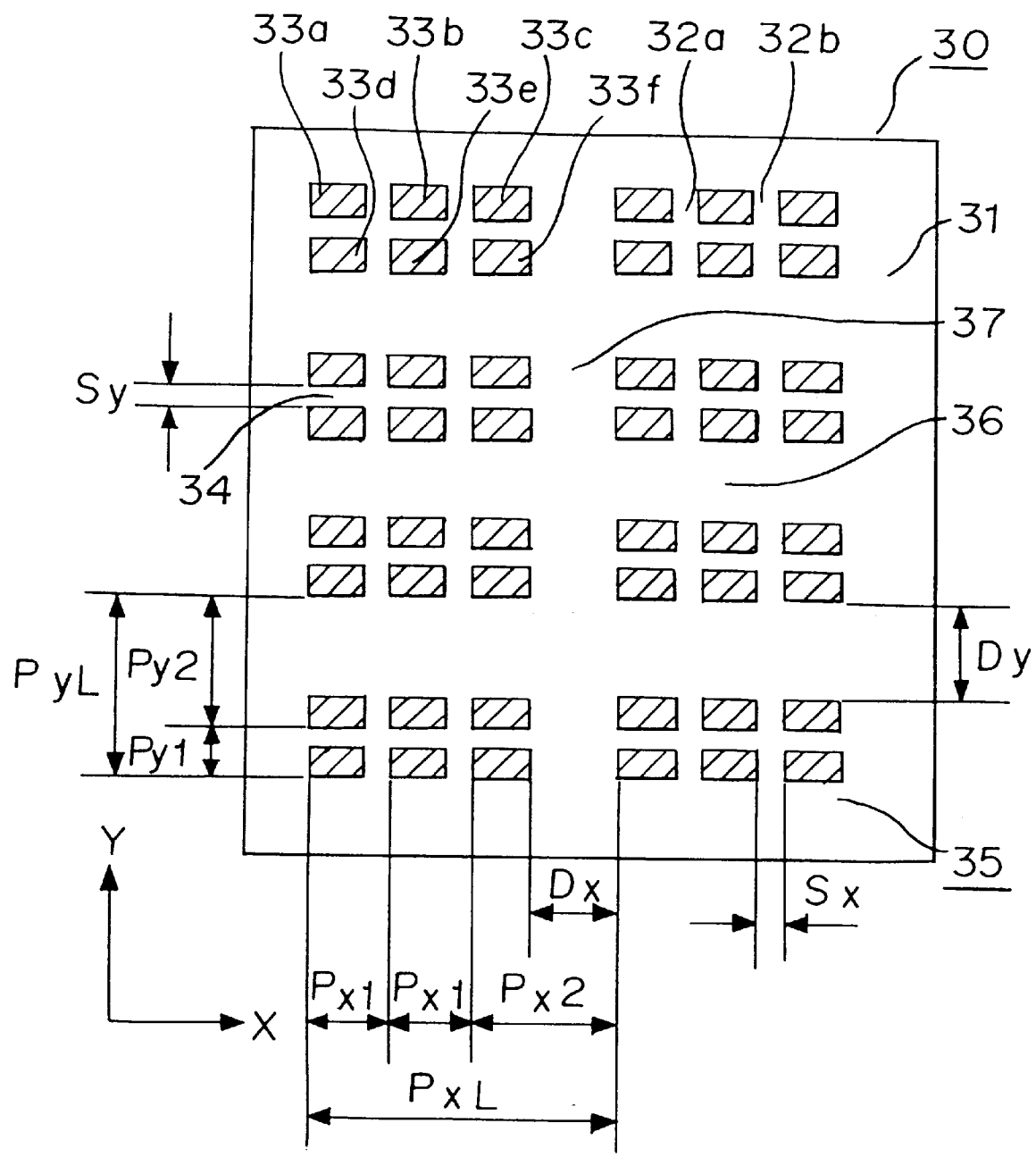
FIG. 10 is a plan view of the photo mask according to a third embodiment of the present invention.

In FIG. 10, there is shown a plan view of the photo mask according to the third embodiment. In FIG. 10, reference numeral 30 designates the photo mask according to this embodiment, reference numeral 31 designates a transparent substrate, reference numeral 32 designates slit-like shaped openings which have a width in the x direction, reference numeral 33 designates light blocking regions which are thin film made of metal such as chromium, reference numeral 34 designates slit-like shaped openings which have a width in the y direction, reference numeral 35 designates a light blocking pattern which is constituted by the light blocking regions 33, reference numeral 36 designates an opening which is arranged between adjacent light blocking patterns 35 in the y direction, and reference numeral 37 designates an opening which is arranged between adjacent light blocking patterns 35 in the x direction.

Referring to FIG. 10, the photo mask 30 includes the rectangular light blocking patterns 35 on a main surfaces of the transparent substrate 31, each of which is divided into the light blocking regions 33a–33f by the slit-like shaped openings 32a, 32b and the slit-like shaped opening 34 in a direction perpendicular to the openings 32a, 32b as second openings, and which are arranged at first large pitches $P_{xL}$ and $P_{yL}$ in the x direction as a first direction and the y direction. The pitches $P_{xL}$ and $P_{yL}$ are large enough to satisfy a relationship of $P_{xL}$ ($P_{yL}$)>$2\lambda/NA(1+\sigma)$ where $\lambda$ represents a wavelength of exposure light in an exposure system, NA represents a numerical aperture of the exposure system and $\sigma$ represents coherency of the exposure light. It is preferable that a ratio of the first pitch $P_{xL}$ to the width $D_x$ of the opening 37 as a first opening in the x direction and a ratio of the first pitch $P_{yL}$ to the width $D_y$ of the opening 36 as the first opening in the y direction are not less than 3. The presence of such a ratio can improve contrast in an optical image as well.

The provision of these slit-like shaped openings makes the pitch in the x direction reduced to an average of the second pitches $P_{x1}$ and $P_{x2}$ and the pitch in the y direction reduced to an average of the second pitches $P_{y1}$ and $P_{y2}$. Thus, the original pitches $P_{xL}$ and $P_{yL}$ are reduced to the average pitches in the x direction and the y direction as in the first embodiment.

The widths $S_x$ and $S_y$ of the slit-like shaped openings may be set to any value as long as the widths $S_x$ and $S_y$ are respectively smaller than the width Dx of the opening 37 and the width Dy of the openings 36. For example, the widths $S_x$ and $S_y$ are set to such respective values that resolution by exposure light becomes impossible and there is no adverse effect on formation of a resist pattern, and the number and the arrangement of the slit-like shaped openings are set depending on a pattern arrangement or optical conditions so as to set the pitches in the arrangement defined by the formula (5) as in the first embodiment.

By application of such a pattern structure, an optical image due to 3 beams interference as shown in FIG. 4 with respect to the first embodiment can be obtained in the x direction and the y direction, offering an advantage in that depth of focus can be improved with respect to a rectangular pattern having a two-dimensional geometry.

The photo mask according to this embodiment can be applied to fabrication of semiconductor devices to offer an advantage in that highly reliable semiconductor devices can be produced as in the first embodiment.

Embodiment 4

In accordance with a fourth embodiment, thin films which are made of a translucent material are provided to restrain the transmission of light in the slit-like openings of the photo mask according to the first embodiment, allowing the width of the slit-like openings to be expanded.

Figure 11:
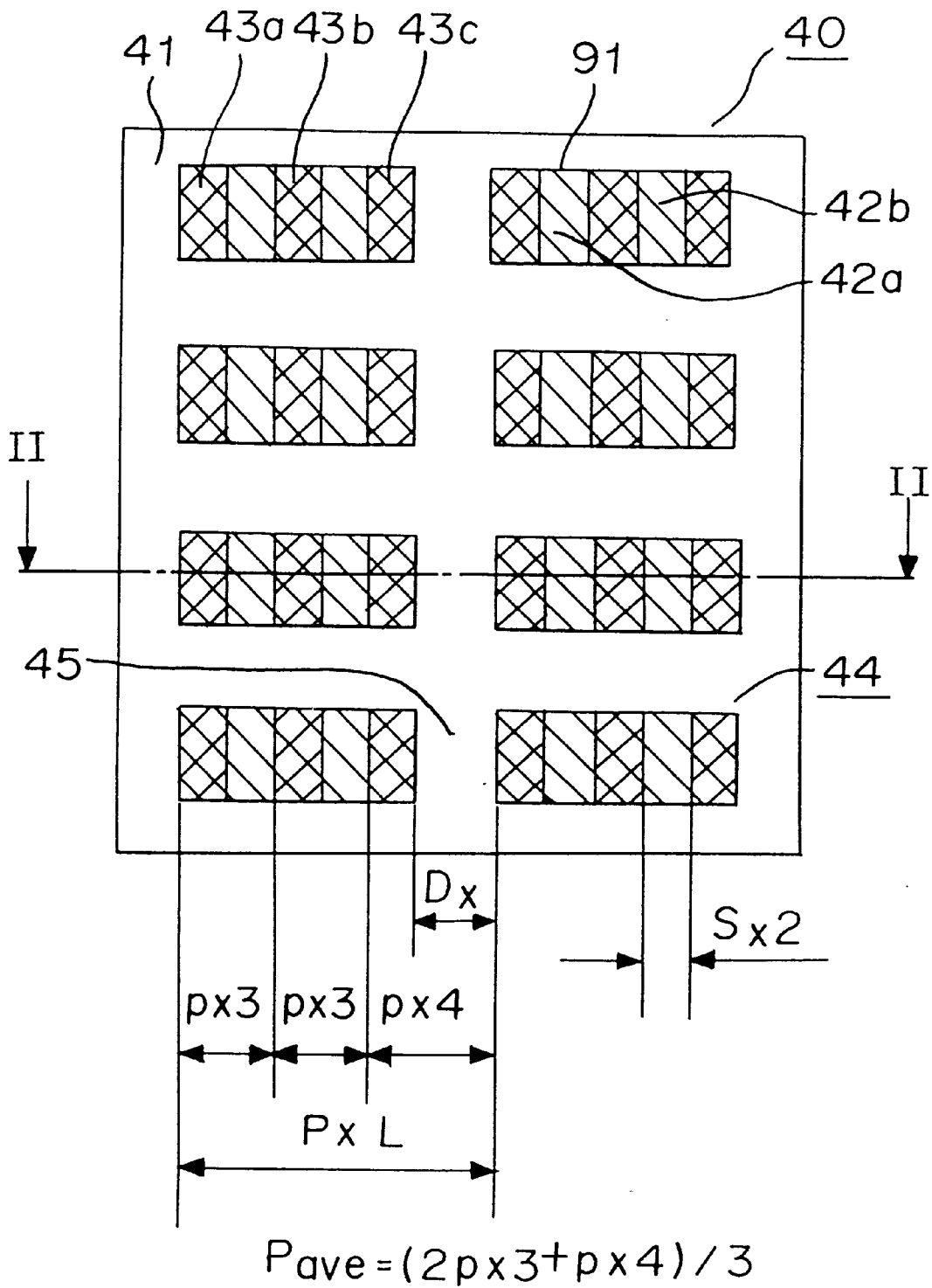
FIG. 11 is a plan view of the photo mask according to a fourth embodiment of the present invention.

In FIG. 11, there is shown a plan view of the photo mask according to the fourth embodiment. In FIG. 12 there is shown a cross-sectional view of the photo mask taken along the line II—II of FIG. 11. In both Figures, reference numeral 40 designates the photo mask according to this embodiment, reference numeral 41 designates a transparent substrate, reference numeral 42 designates light blocking regions which are a thin film made of metal such as chromium, reference numeral 44 designates a light blocking pattern which is constituted by the light blocking regions 43, reference numeral 45 designates an opening between the light blocking patterns 44, and reference numeral 91 designates a thin film which is made of a translucent material.

Referring to FIGS. 11 and 12, the photo mask 40 according to the fourth embodiment includes the rectangular light blocking patterns 44 on a main surface of the transparent substrate 41, each of which is divided into the light blocking regions 43a, 43b and 43c by the slit-like shaped openings 42a and 42b. The slit-like shaped openings 42a and 42b are provided on the respective rectangular thin films 91 made of a translucent material, which are arranged at a pitch $P_{xL}$ as a first pitch. The pitch $P_{xL}$ is large enough to satisfy a relationship of $P_{xL} > 2\lambda/NA(1+\sigma)$ where $\lambda$ represents a wavelength of exposure light in an exposure system, NA represents a numerical number of the exposure system and $\sigma$ represents coherency of the exposure light. It is preferable that a ratio of the pitch $P_{xL}$ to the width $D_x$ of the opening 45 as a first opening is not less than 3. Such a ratio can improve contrast in an optical image.

By application such a pattern structure, the pitch $P_{xL}$, which is large in the x direction as a first direction, can be reduced to an average of pitches $P_{x3}$ and $P_{x4}$ as second pitches, deviating the second order diffraction light or higher order diffraction light out of the pupil plane as in the first embodiment. Since the slit-like shape openings 42 are provided on the substrate through the thin films 91, the light which passes through the slit-like shaped openings 42 is weakened by the thin films 91, which is different from the first embodiment.

In FIG. 13, there are shown the cross-sectional view of the photo mask taken along the line II—II of FIG. 11, and a schematic view of a light intensity distribution of incident light which has passed through the photo mask. In FIG. 13, reference numeral 81 designates the intensity of the light which has passed through the opening between the light blocking patterns 44, and reference numeral 82 designates the intensity of the light which has passed through a slit-like shaped opening 42.

Although expansion of the opening width normally makes the light intensity of the transmission light in that portion stronger, the interposition of the thin films 91 made of a translucent material makes the light intensity weaker according to this embodiment. If the intensity of the transmission light passing through the opening 42 is allowed to be increased up to the intensity of the transmission light passing through the openings 12 which has no adverse effect on formation of the resist pattern according to the first embodiment, a slit width $S_{x2}$ of the openings 42 can be made larger than the slit width $S_x$ of the openings 12 by such an increase. For example, if an MOSION film or a CrON film having a transmission of not less than 30% is used as the translucent material, the width of the slit-like shaped openings can be extended to about 0.14 μm in this embodiment while the slit width $S_x$ is about 0.1 μm in use of exposure light from a KrF excimer laser (wavelength: λ=248 nm) in the first embodiment. As a result, it becomes remarkably easy to prepare a photo mask with such fine slit-like shaped openings.

Now, a method for fabricating the photo mask according to this embodiment will be described.

In FIGS. 14(a)–(e), there are shown of cross-sectional views of fabrication steps for the photo mask. In FIGS. 14(a)–(e), reference numeral 41 designates the transparent substrate, reference numeral 43 designates the light blocking regions, reference numeral 46 designates a thin metallic film made of e.g. chromium, reference numerals 47 and 48 designate resist patterns, reference numeral 91 designates a thin film region which is made of a translucent material, and reference numeral 92 designates the thin film which is made of a translucent material.

Figure 14:
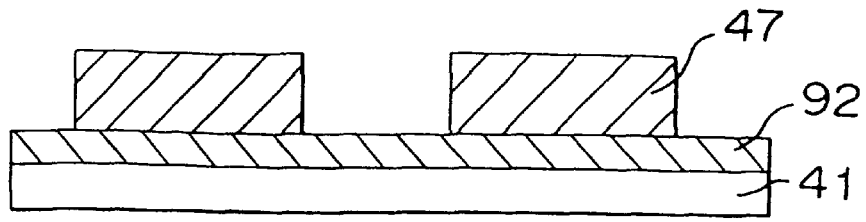
FIGS. 14(a)–(e) are cross-sectional views showing fabrication steps of the photo mask according to the fourth embodiment.
Figure 14:
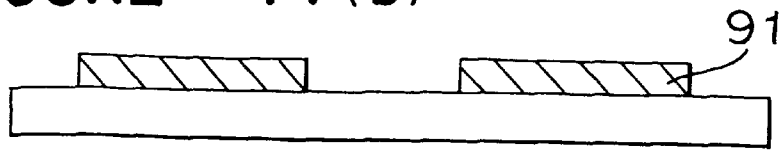
Figure 14:
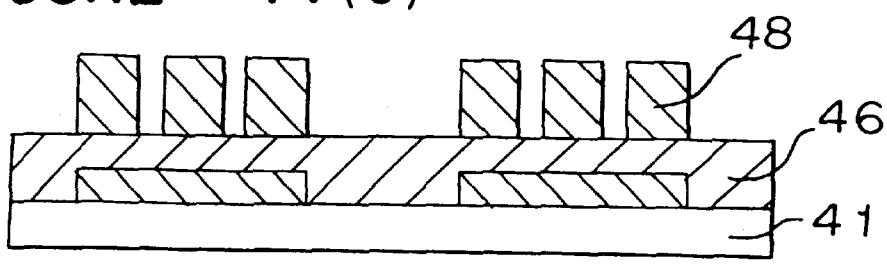
Figure 14:
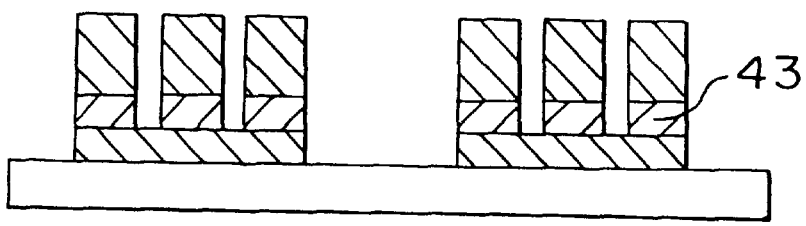
Figure 14:
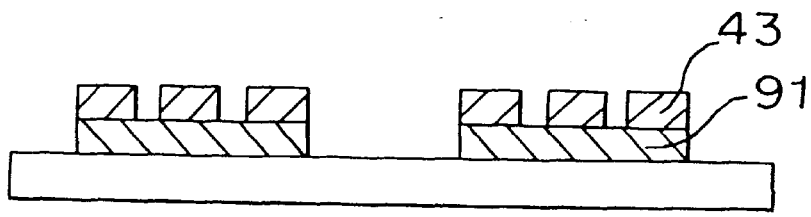
Figure 15:
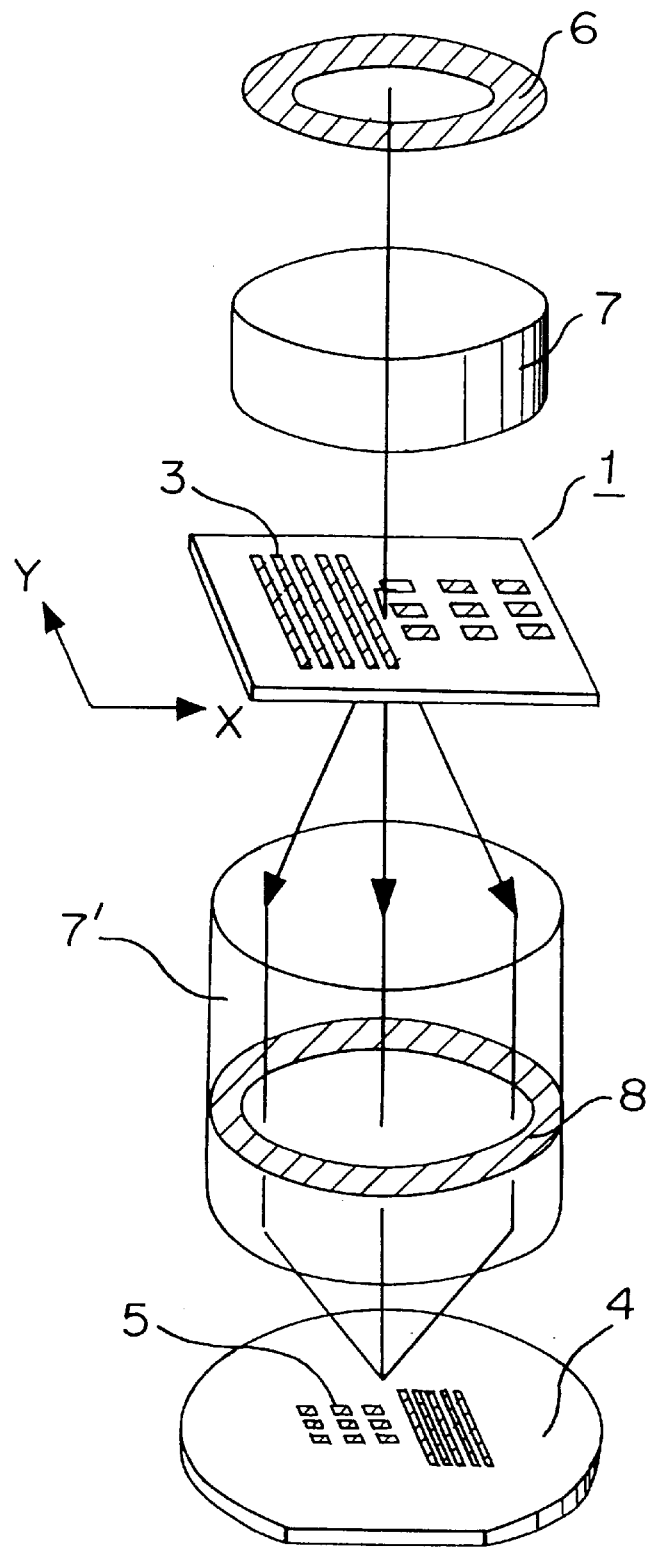
FIG. 15 is a schematic view of a conventional reduction-type projection exposure system.

As shown in FIG. 14(a), the thin film 92 which is made of a translucent material such as MOSION is deposited on the transparent substrate 41 by sputtering or CVD, and the resist pattern 47 is deposited on the thin film 92 so as to have a desired shape. Next, as shown in FIG. 14(b), the thin film 92 is dry-etched to be patterned using the resist pattern 47 as a mask, and the remaining resist is eliminated to provide a pattern which is constituted by the thin translucent film region 91. Next, as shown in FIG. 14(c), the thin metallic film 46 which is made of e.g. chromium is deposited on the transparent substrate 41 and the thin translucent film regions 91, and the resist pattern 48 is deposited on the thin metallic film 46 so as to have a desired shape. Next, as shown in FIG. 14(d), the thin metallic film 46 is dry-etched to be patterned using the resist pattern 48 as a mask. After that, the remaining resist is eliminated, obtaining a photo mask wherein the light blocking regions 43 which are made of thin metallic film 46 are provided on the thin translucent film regions 91 so as to have a desired pattern as shown in FIG. 14(e).

This embodiment can offer not only an advantage similar to the first embodiment but also an advantage in that preparation for the photo mask becomes easy.

By applying the photo mask according to this embodiment to fabrication of semiconductor devices, there is offered an advantage in that highly reliable semiconductor devices can be produced as in the first embodiment.

Although this embodiment is considered with respect to a case wherein there is a large pitch in the x direction, a pattern structure similar to the second embodiment can be applied if the rectangular patterns are arranged at a large pitch in the y direction as well. In this case, depth of focus can be improved with respect to the rectangular patterns having a two-dimensional geometry as in the third embodiment.

Although the slit-like shaped openings or the rectangular openings are arranged in the embodiments as stated earlier, the openings may have any shape as long as the pitch in a certain direction can be virtually reduced.

Although explanation of this embodiment has been made with respect to a circular illumination method, the embodiments can be applied to a modified illumination method, further improving depth of focus.

In addition, the present invention can be combined with another conventional technique such as the Attenuated phase shifting technique to improve depth of focus to the entire surface of the photo mask wherein the patterns having various sizes of pitches mingle.

The resist which is applicable to the photo mask according to this embodiment includes not only a so-called positive resist wherein a resist on an exposed portion is left behind but also a so-called negative resist wherein a resist on an exposed portion is dissolved. The photo mask according to this embodiment is effective for such types of resists. When the photo mask according to this embodiment is applied to such a negative resist, hole patterns having a rectangular shape can be formed.

Obviously, numerous modifications and variations of the present invention are possible in light of the above teachings. It is therefore to be understood that within the scope of the appended claims, the invention may be practiced otherwise than as specifically described herein.

What is claimed is:

1. A photo mask comprising:

a transparent substrate; and at least two light blocking regions;

wherein said at least two light blocking regions are separated by a first opening and arranged at a first pitch $P_1$ satisfying the following relationship on a main surface of said transparent substrate in a first direction:

$$P_1 > 2\lambda/NA\ (1+\sigma)$$

where $\lambda$ represents a wavelength of exposure light in an exposure system, NA represents a numerical aperture of said exposure system and $\sigma$ represents coherency of said exposure light; and wherein said at least two light blocking regions are formed with second openings at second pitches smaller than said first pitch in said first direction and said second openings have said exposure light transmitting therethrough, which has a weaker intensity than said exposure light transmitting through said first opening.

2. The photo mask according to claim 1, wherein a ratio of said first pitch to a width of said first opening in said first direction is set to not less than 3.

3. The photo mask according to claim 1, wherein said main surface of said transparent substrate is provided with a thin film made of a translucent material to decrease transmittance of said exposure light transmitting through said second openings.

4. The photo mask according to claim 1, wherein said second openings are arranged so that an average of said second pitches in said first direction is smaller than $2\lambda/NA\ (1+\sigma)$ and not less than NA.

5. A method for fabricating a semiconductor device comprising the steps of:

providing a resist;

exposing the resist using a photo mask comprising:
a transparent substrate; and
at least two light blocking regions;

wherein said at least two light blocking regions are separated by a first opening and arranged at a first pitch $P_1$ satisfying the following relationship on a main surface of said transparent substrate in a first direction:

$$P_1 > 2\lambda/NA\ (1+\sigma)$$

where $\lambda$ represent a wavelength of exposure light in an exposure system, NA represents a numerical aperture of said exposure system and $\sigma$ represents coherency of said exposure system; and wherein said at least two light blocking regions are formed with second openings at second pitches smaller than said first pitch in said first direction and said second openings have said exposure light transmitting therethrough which has a weaker intensity than said exposure light transmitting through said first opening; and developing said exposed resist to form resist patterns at the first pitch.

* * * * *